United States Patent [19]
Yukinobu et al.

[11] Patent Number: 5,849,221
[45] Date of Patent: Dec. 15, 1998

[54] RAW MATERIAL FOR PRODUCING POWDER OF INDIUM-TIN OXIDE ACICULAE AND METHOD OF PRODUCING THE RAW MATERIAL, POWDER OF INDIUM-TIN OXIDE ACICULAE AND METHOD OF PRODUCING THE POWDER, ELECTROCONDUCTIVE PASTE AND LIGHT-TRANSMITTING ELECTROCONDUCTIVE FILM

[75] Inventors: Masaya Yukinobu; Morikazu Kojima, both of Niihama; Mitsuo Usuba, Takanezawa-machi, all of Japan

[73] Assignee: Sumitomo Metal Mining, Co., Ltd., Tokyo, Japan

[21] Appl. No.: 662,150

[22] Filed: Jun. 12, 1996

Related U.S. Application Data

[62] Division of Ser. No. 222,280, Apr. 4, 1994, Pat. No. 5,580,496.

[30] Foreign Application Priority Data

| Apr. 5, 1993 | [JP] | Japan | 5-101970 |
| Apr. 5, 1993 | [JP] | Japan | 5-101971 |
| Apr. 5, 1993 | [JP] | Japan | 5-101972 |
| Apr. 23, 1993 | [JP] | Japan | 5-120518 |
| Feb. 17, 1994 | [JP] | Japan | 6-043071 |
| Feb. 24, 1994 | [JP] | Japan | 6-051166 |

[51] Int. Cl.$^6$ .............................. H01B 1/06; H01B 1/08
[52] U.S. Cl. .................... 252/519.3; 252/520.1; 252/519.33; 252/518.1
[58] Field of Search .................. 252/518, 518.1, 252/519.3, 519.33

[56] References Cited

U.S. PATENT DOCUMENTS

| 4,594,182 | 6/1986 | Hashimoto et al. | 252/518 |
| 4,824,221 | 4/1989 | Endo et al. | 350/37 |
| 4,894,184 | 1/1990 | Fukuoka et al. | 252/512 |
| 5,320,922 | 6/1994 | Mayama et al. | 430/63 |
| 5,411,792 | 5/1995 | Yukinobu et al. | 428/212 |

*Primary Examiner*—Mukund J. Shah
*Assistant Examiner*—Deepak Rao
*Attorney, Agent, or Firm*—Watson Cole Grindle Watson, P.L.L.C.

[57] ABSTRACT

Disclosed are a powder of indium-tin oxide aciculae suitable as an electroconductive filler for an electroconductive ink to be used for forming a transparent electroconductive film, a method for producing a raw material to be used for producing the powder of indium-tin oxide aciculae, which has a major diameter of 5 $\mu$m or more and a ratio of the major diameter to the minor diameter of 5 or more, an electroconductive paste capable of forming a light-transmitting electroconductive film having sufficient electroconductivity and light transmittance by printing, such as screen-printing, followed by high-temperature baking, and a light-transmitting electroconductive film to be formed from the paste. The raw material is produced by heating and concentrating an aqueous solution containing indium ions and nitrato ions to form a high-viscosity slurry followed by separating a powder of aciculae from the slurry. By calcining the raw material, a powder of indium-tin oxide aciculae is produced.

4 Claims, 17 Drawing Sheets

RAW MATERIAL FOR PRODUCING POWDER OF INDIUM-TIN OXIDE ACICULAE AND METHOD OF PRODUCING THE RAW MATERIAL, POWDER OF INDIUM-TIN OXIDE ACICULAE AND METHOD OF PRODUCING THE POWDER, ELECTROCONDUCTIVE PASTE AND LIGHT-TRANSMITTING ELECTROCONDUCTIVE FILM

CROSS-REFERENCE TO RELATED APPLICATION

This is a divisional of application Ser. No. 08/222,280, filed Apr. 4, 1994, now U.S. Pat. No. 5,580,496.

FIELD OF THE INVENTION

The present invention relates to a powder of indium-tin oxide aciculae (needle-like crystals) which is most suitable for an electroconductive filler for electroconductive ink to be used for forming a transparent electroconductive film, a raw material to be used for producing the powder, and electroconductive paste and film which contain the powder of indium-tin oxide aciculae and which are used for forming light-transmitting electrodes such as those in electroluminescence (EL) devices, etc.

BACKGROUND OF THE INVENTION

In a coating method for obtaining a transparent electroconductive film by coating an electroconductive ink on a substrate, used is an oxide filler such as indium-tin oxide (ITO), tin-antimony oxide (ATO), etc., as the electroconductive filler in the ink. Of these, ITO is the best, as having a low resistance value than ATO.

Of electroconductive inks, those having a smaller content of the electroconductive filler therein are more preferred. This is because the light absorption of the filler of an oxide is far larger than that of a transparent resin which is another component in the ink. Therefore, if a film having a low resistance value is obtained, using the least possible amount of the oxide filler relative to the resin, the light transmittance of the film may be improved.

Regarding the electroconductive filler of the kind, acicular (needle-like) or flaky ones are considered preferable. This is because smaller amounts of them may be used for obtaining films having a low resistance value, as compared with using spherical or granular electroconductive fillers, and the films are satisfactory with respect to the cost, the physical strength, the weather resistance, etc.

There are known a method of obtaining flaky oxides by freezing a colloid liquid of an inorganic oxide or hydroxide so as to make fine particles of the oxide or hydroxide precipitated among the solvent molecules of the colloid liquid followed by drying it so as to remove the solvent therefrom and, for the hydroxide, further roasting it to, finally obtain flaky oxides (see Japanese Patent Laid-Open No. 62-3003), and a method of obtaining tin oxide aciculae by heating and decomposing tin oxalate aciculae (see Japanese Patent Laid-Open No. 56-120519). However, powder of ITO aciculae having a high aspect ratio has not been obtained.

As conventional electroconductive pastes to be used for forming light-transmitting electrodes such as those in electroluminescence (EL) devices, etc., known are a paste that is obtained by dispersing an electroconductive filler comprising an ultra-fine powder of indium-tin oxide (ITO) in a solvent containing a resin dissolved therein, and a paste that is obtained by dispersing a powder of ITO flakes in a solvent containing a resin dissolved therein.

In organic dispersion-containing EL devices, the substrate has a light-emitting zinc sulfide (ZnS) layer formed thereon by screen-printing or blade-coating and has thereover a light-transmitting electroconductive film formed by coating an electroconductive paste thereon by screen-printing or the like.

In the electroconductive paste containing an ultra-fine powder of ITO as the electroconductive filler, the amount of the electroconductive filler must be much more than that of the resin so as to obtain the intended electroconductivity. It is said that the light-transmitting electroconductive film is desired to be thin, preferably having a thickness of approximately from 2 to 3 $\mu$m, so as to obtain the necessary light transmittance.

The printed surface of the light-emitting zinc sulfide layer is often rough, since the particles of zinc sulfide therein have a size of several ten $\mu$m. Therefore, when an electroconductive paste is coated thereover, the film of the electroconductive paste becomes uneven due to the roughness of the surface of the zinc sulfide layer to partly have a thickness of 1 $\mu$m or less or a thickness of 5 $\mu$m or more, and a uniform electroconductive film having a thickness of from 2 to 3 $\mu$m cannot be formed on the whole surface of the light-emitting layer. The thin parts of the coated electroconductive film were often cracked to unfavorably increase the resistance of the film.

In the electroconductive paste that is prepared by dispersing a powder of ITO flakes in a solvent containing a resin dissolved therein, the content of the electroconductive filler may be smaller than that of the resin in order to obtain the intended electroconductivity. Therefore, even if it is coated at a thickness of 5 $\mu$m or more, the coated film may have sufficient light transmittance. For this reason, the roughness of the surface of the zinc sulfide layer does not cause so much significant problem in this case. However, it is impossible to say that the resistance of the film is sufficient.

Of dispersion-containing EL devices, known are those that are produced by a high-temperature process using an inorganic binder such as glass or the like, at 500° to 600° C. For producing EL devices of this type, for example, a white enamel layer comprising $BaTiO_3$, $TiO_2$ or the like is formed on a low-carbon steel plate by baking it, and a fluorescent layer is formed thereon by baking a mixture comprising a transparent glass having a low melting point and a high dielectric constant and a fluorescent powder. In these devices, a NESA film that is formed by chemical vapor deposition (CVD) of a chloride is used as the light-transmitting electrode.

However, the NESA film has the following drawbacks:

(1) As this is formed by CVD, the electroconductive film is formed on the whole surface and it is difficult to pattern the film.

(2) All the white enamel layer, the fluorescent layer and the transparent protective layer (which is formed on the light-transmitting electroconductive film) are formed by printing, for example, by screen-printing or the like, but only the NESA film is formed by CVD. Therefore, the NESA film is inconvenient for simplifying the production process.

SUMMARY OF THE INVENTION

Given the situations as mentioned above, the present invention is to provide a powder of indium-tin oxide aciculae suitable as an electroconductive filler for an electroconductive ink to be used for forming a transparent electroconductive film, a method for producing a raw material to be used for producing the powder of indium-tin oxide aciculae, which has a length of 5 μm or more and a ratio of length to cross-sectional diameter of 5 or more, an electroconductive paste capable of forming a light-transmitting electroconductive film having sufficient electroconductivity and light transmittance by printing, such as screen-printing or the like, followed by high-temperature baking, and a light-transmitting electroconductive film to be formed from the paste.

The gist of the present invention is comprised of the following:

(1) A method for producing a first raw material to be used for producing a powder of indium-tin oxide aciculae, characterized in that an aqueous solution containing indium ions and nitrato ions is heated and concentrated to form a high-viscosity slurry and a powder of aciculae is separated from the slurry.

(2) A method for producing a first raw material to be used for producing a powder of indium-tin oxide aciculae, characterized in that an aqueous solution containing indium ions and nitrato ions and also containing indium hydroxide and/or indium oxide is heated and concentrated to form a high-viscosity slurry and a powder of aciculae is separated from the slurry.

(3) A preferred embodiment of the above-mentioned (1) or (2) for producing a first raw material to be used for producing a powder of indium-tin oxide aciculae, in which the slurry is mixed with a large amount of water or with a large amount of water containing an alkali component and subjected to solid-liquid separation.

(4) A preferred embodiment of the above-mentioned (1) or (2) for producing a first raw material to be used for producing a powder of indium-tin oxide aciculae, in which the slurry is filtered to obtain a filtered cake and the cake is mixed with a large amount of water or with a large amount of water containing an alkali component and subjected to solid-liquid separation.

(5) A method for producing a first raw material to be used for producing a powder of indium-tin oxide aciculae, characterized in that lithium nitrate or a nitrate containing lithium nitrate is added to an aqueous solution containing indium ions and nitrato ions, then the solution is heated and concentrated to form a high-viscosity slurry, and a powder of aciculae is separated from the slurry.

(6) A method for producing a second raw material to be used for producing a powder of indium-tin oxide aciculae, characterized in that the first raw material for producing a powder of indium-tin oxide aciculae that has been produced according to the method of the above-mentioned (1) or (2) is reacted with an aqueous alkaline solution.

(7) A powder of indium oxide aciculae for producing a powder of indium-tin oxide aciculae, which have a length of 5 μm or more and a ratio of length to cross-sectional diameter of 5 or more.

(8) A method for producing a powder of indium oxide aciculae to be used for producing a powder of indium-tin oxide aciculae, which have a of 5 μm or more and a ratio of length to cross-sectional diameter of 5 or more; the method being characterized in that the first raw material for producing a powder of indium-tin oxide aciculae that has been produced according to anyone of the methods of the above-mentioned (1) to (5) or the second raw material for producing a powder of indium-tin oxide aciculae that has been produced according to the method of the above-mentioned (6) is calcined.

(9) A method for producing a powder of indium-tin oxide aciculae, characterized in that an aqueous solution containing indium ions, nitrato ions and a tin compound capable of being converted into $SnO_2$ by calcination is heated and concentrated to form a high-viscosity slurry, a first intermediate powder of aciculae is separated from the slurry, and the powder is then calcined.

(10) A method for producing a powder of indium-tin oxide aciculae, characterized in that an aqueous solution containing indium ions, nitrato ions, indium hydroxide and/or indium oxide, and a tin compound capable of being converted into $SnO_2$ by calcination is heated and concentrated to form a high-viscosity slurry, a first intermediate powder of aciculae is separated from the slurry, and the powder is then calcined.

(11) A method for producing a powder of indium-tin oxide aciculae, characterized in that an aqueous solution containing indium ions, nitrato ions and an indium-tin oxide is heated and concentrated to form a high-viscosity slurry, a first intermediate powder of aciculae is separated from the slurry, and the powder is then calcined.

(12) A preferred embodiment of anyone of the above-mentioned (9), (10) and (11) for producing a powder of indium-tin oxide aciculae, in which the slurry is mixed with a large amount of water or with a large amount of water containing an alkali component and subjected to solid-liquid separation.

(13) A preferred embodiment of anyone of the above-mentioned (9), (10) and (11) for producing a powder of indium-tin oxide aciculae, in which the slurry is filtered to obtain a filtered cake and the cake is mixed with a large amount of water or with a large amount of water containing an alkali component and subjected to solid-liquid separation.

(14) A preferred embodiment of anyone of the above-mentioned (9) to (13) for producing a powder of indium-tin oxide aciculae, in which the first intermediate powder of aciculae is reacted with an aqueous alkaline solution to obtain a second intermediate powder of aciculae and the second intermediate powder is calcined.

(15) A preferred embodiment of anyone of the above-mentioned (9) to (14) for producing a powder of indium-tin oxide aciculae, in which the calcination is effected in an inert gas or in vacuum.

(16) A method for producing a powder of indium-tin oxide aciculae, characterized in that an aqueous solution containing indium ions and nitrato ions is heated and concentrated to form a high-viscosity slurry, a first intermediate powder of aciculae is separated from the slurry, and the aciculae of the first intermediate powder are coated with a tin compound capable of being converted into tin dioxide by calcination and then calcined.

(17) A method for producing a powder of indium-tin oxide aciculae, characterized in that an aqueous solution containing indium ions, nitrato ions, and indium hydroxide and/or indium oxide is heated and concentrated to form a high-viscosity slurry, a first intermediate powder of aciculae is separated from the slurry, and the aciculae of the first intermediate powder are coated with a tin compound capable of being converted into tin dioxide by calcination and then calcined.

(18) A preferred embodiment of the above-mentioned (16) or (17) for producing a powder of indium-tin oxide aciculae, in which the slurry is mixed with a large amount of water or with a large amount of water containing an alkali component and subjected to solid-liquid separation.

(19) A preferred embodiment of anyone of the above-mentioned (16) or (17) for producing a powder of indium-tin oxide aciculae, in which the slurry is filtered to obtain a filtered cake and the cake is mixed with a large amount of water or with a large amount of water containing an alkali component and subjected to solid-liquid separation.

(20) A method for producing a powder of indium-tin oxide aciculae, characterized in that the first intermediate powder of aciculae that has been produced according to anyone of the methods of the above-mentioned (16) to (19) is reacted with an aqueous alkaline solution to obtain a second intermediate powder of aciculae, and the aciculae of the second intermediate powder are coated with a tin compound capable of being converted into tin dioxide by calcination and then calcined.

(21) A method for producing a powder of indium-tin oxide aciculae, characterized in that the first intermediate powder of aciculae that has been produced according to anyone of the methods of the above-mentioned (16) to (19) or the second intermediate powder of aciculae that has been produced according to the method of the above-mentioned (20) is calcined to obtain a powder of indium oxide aciculae, and the aciculae of the indium oxide powder are coated with a tin compound capable of being converted into tin dioxide by calcination and then calcined.

(22) A preferred embodiment of anyone of the above-mentioned (16) to (21) for producing a powder of indium-tin oxide aciculae, in which the calcination is effected in an inert gas or in vacuum.

(23) An electroconductive paste containing a powder of indium-tin oxide aciculae having a length diameter of 5 µm or more and a ratio of length to the sectional diameter of 5 or more, in a resin along with its solvent.

(24) A preferred embodiment of the electroconductive paste of the above-mentioned (23), in which the ratio by weight of the fine powder of indium-tin oxide aciculae to the resin is from 60:40 to 80:20.

(25) An electroconductive paste for high-temperature baking, which contains a transparent glass frit, a solvent and a fine powder of indium-tin oxide aciculae having a length major diameter of 5 µm or more and a ratio of length to the cross-sectional of 5 or more.

(26) A preferred embodiment of the electroconductive paste of the above-mentioned (25), in which the ratio by volume of the fine powder of indium-tin oxide aciculae to the transparent glass frit is from 10:90 to 50:50.

(27) A light-transmitting electroconductive film composed of a fine powder of indium-tin oxide aciculae and a resin, which is characterized in that the specific resistance of the film is 1.0 Ω.cm or less and the content of the fine powder of indium-tin oxide aciculae in the film is 25% by volume or less.

(28) A light-transmitting electroconductive film composed of a fine powder of indium-tin oxide aciculae and a glass, which is characterized in that the specific resistance of the film is 5.0 Ω.cm or less.

DETAILED DESCRIPTION OF THE INVENTION

Figure 1:
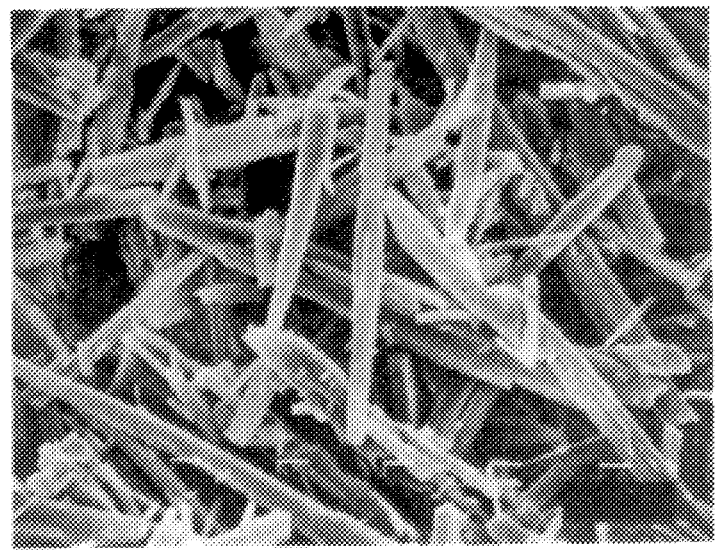
FIG. 1 is an electromicroscopic photograph showing the crystal structure of the first raw material for producing a powder of indium-tin oxide aciculae, that was obtained in Example 1 of the present invention.

The aqueous solution containing indium ions ($In^{3+}$) and nitrato ions ($NO_3^-$), which is used in the present invention, is obtained by dissolving an indium metal in nitric acid, and it may also be formed by dissolving indium hydroxide, which is a gel-like white precipitate to be formed by adding an alkali to an aqueous solution of indium oxide or an indium(III) salt and which is in the form of $In(OH)_3$ in its solution, in nitric acid. The concentrations of indium and nitric acid are not specifically defined. However, if the indium concentration is too low or, that is, if nitric acid and water are too much, much time and much energy are needed when the aqueous solution is concentrated under heat. Therefore, such is unfavorable.

Regarding the molar ratio of indium to nitric acid in the aqueous solution, the presence of an excess amount of nitric acid, relative to indium, is not preferred, since too much time is needed for vaporizing nitric acid in the concentration step. Therefore, the molar ratio of nitric acid/indium in indium nitrate $[In(NO_3)_3]$ is preferably about 3. The ratio may be controlled by dissolving indium hydroxide and/or indium oxide in the solution obtained by dissolving indium in nitric acid.

As the tin compound to be added to the solution, employable are tin salts that may be converted into $SnO_2$ by heating them in an oxygen-containing atmosphere or inert gas, in vacuum, etc., such as halides of divalent tin or tetravalent tin, hydrates of such halides, stannous hydroxide, etc.

When an aqueous solution containing indium ions and nitrato ions, an aqueous solution containing indium ions, nitrato ions, and lithium nitrate or a nitrate containing lithium nitrate, or an aqueous solution containing indium ions, nitrato ions and a tin compound is heated and concentrated, water and nitric acid are vaporized out from the system during the process where the liquid temperature rises up to approximately 130° to 180° C. or so, whereupon the solution gradually becomes a thick slurry while fine acicular (needle-like) crystals which are considered to be basic nitrates begin to form in the aqueous solution. By analysis, the acicular crystals were found to be comprised of approximately from 55 to 68% by weight of In and approximately from 5 to 23% by weight of $NO_3^-$, in general. In the present invention, since the exact chemical composition of these acicular crystals cannot be determined, they are referred to as a first raw material for producing a powder of indium-tin oxide aciculae or as a first intermediate powder of aciculae.

The same shall apply to the concentration of the aqueous solution to which indium hydroxide and/or indium oxide have/has been added. In this case, when water and nitric acid are removed from the system by concentration under heat, then indium becomes saturated, and when the concentration is continued further, then powdery aciculae of the first raw material for producing a powder of indium-tin oxide aciculae or the powdery aciculae of the first intermediate begin to precipitate in the system.

Although the same acicular crystals may be obtained even when the aqueous solution containing indium ions and nitrato ions is directly heated and concentrated, it is preferred to add lithium nitrate or a nitrate containing lithium nitrate to the aqueous solution prior to the concentration under heat because the yield of the acicular crystals to be formed in the system, per the indium content therein, is elevated. For instance, when lithium nitrate or a nitrate containing lithium nitrate is added to the aqueous solution, approximately from 40 to 60% of indium in the system may be recovered as acicular crystals; while only approximately from 10 to 30% (generally from 15 to 20%) of the same is recovered as acicular crystals in the absence of it but the remaining indium of from 70 to 90% will be used repeatedly.

As nitrates which are usable along with lithium nitrate, mentioned are sodium nitrate, potassium nitrate, calcium nitrate, magnesium nitrate, ammonium nitrate, etc., which, however, are not limitative.

The reason why the addition of lithium nitrate or a nitrate containing lithium nitrate is effective in the present invention is considered because of the affinity of indium nitrate with lithium nitrate.

As mentioned above, the powdery aciculae of the raw material for producing a powder of indium-tin oxide aciculae or the powdery aciculae of the first intermediate are precipitated in the concentrated thick solution (slurry) by concentration under heat. The concentrated thick solution is syrupy and, after cooled, it becomes highly viscous to be finally solidified. It is suitable that the high-viscosity slurry has a solid content of approximately from 5 to 30% by weight. Over-concentration to make the slurry concentration too high is unfavorable, since the aciculae formed will lose their needle-like form and have a small aspect ratio.

Regarding the size of the powdery aciculae of the first raw material for producing a powder of indium-tin oxide aciculae or that of the powdery aciculae of the first intermediate, the length thereof may be 5 $\mu$m or more and the axial ratio thereof may be 5 or more. As the case may be, the axial ratio thereof may be from 20 to 30 or more. The length and the axial ratio vary, depending on the conditions for concentration and the tin compounds to be added.

To separate the powdery aciculae of the raw material for producing a powder of indium-tin oxide aciculae from the high-viscosity slurry containing them, the high-viscosity slurry is put in a large amount of water or in a large amount of water containing an alkali so as to dilute only the concentrated thick solution of the slurry, then this is filtered and the separated aciculae are washed and dried. The washing after the filtration is preferably effected with pure water and alcohol.

Alternatively, only the concentrated thick solution is separated from the slurry by filtration under reduced pressure, filtration under elevated pressure, centrifugation or the like, and thereafter the filtered cake is put in a large amount of water or in a large amount of water containing an alkali so as to dilute the thick solution adhered to the cake, and the cake is again filtered out, washed and dried to obtain the powdery aciculae of the first raw material for producing a powder of indium-tin oxide aciculae or the powdery aciculae of the first intermediate. In order to smoothly carry out the filtration, it may be effected at a temperature of 100° C. or higher, preferably from 150° to 180° C. If the temperature for the filtration is too low, the viscosity of the thick solution is high and much time is needed for the filtration.

In the process, the thick filtrate to be obtained by the filtration of the high-viscosity slurry may be used repeatedly as it is. If desired, the thick filtrate is diluted with water and then neutralized with an alkali to give hydroxides, which may be recovered and dissolved in nitric acid to be used in the step, or it may be directly circulated to the step.

If the mixture prepared by mixing the slurry or the filtered cake with a large amount of water or a large amount of water containing an alkali is left as it is for a long period of time, for example, for about one day, it will be hydrolyzed to give fine granules of indium hydroxide without forming aciculae. Therefore, it is preferred to rapidly filter the mixture.

The slurry or the filtered cake is put in a large amount of water. This is because if it is put in a small amount of water, the first raw material for producing a powder of indium-tin oxide aciculae or the first intermediate powder of aciculae will dissolve in the solution. The dissolution may be prevented if water of about 40 times or more by weight the slurry or the filtered cake is used. On the other hand, when water containing an alkali, for example, water containing ammonia is used, its amount to be used may be smaller than the amount of water only. However, if a too strong alkaline water is used, the slurry will be neutralized with it to give hydroxide precipitates so that the separation of the first raw material for producing a powder of indium-tin oxide aciculae or the first intermediate powder of aciculae from the slurry will become impossible. Therefore, the concentration of the alkaline solution to be used is limited to such that the solution gives no hydroxide precipitates.

The washing of the separated precipitates after the filtration is effected with water. If desired, the thus-washed precipitates may be further washed with an alkaline water such as aqueous ammonia or the like. For instance, when they are additionally washed with aqueous ammonia, the nitric acid existing in the first raw material for producing a powder of indium-tin oxide aciculae or the first intermediate powder of aciculae may be removed from the precipitates to give powdery aciculae of indium hydroxide, which probably has a composition of In and O, OH and/or $H_2O$, and the powdery aciculae do not generate NOx when they are calcined later. Therefore, the additional washing is preferred. Even by the additional washing with such an alkaline water, the needle-like form of the washed aciculae does not change at all and powdery aciculae having a length of 5 $\mu$m or more and an axial ration of 5 or more may be obtained. In the present invention, the powdery aciculae are referred to as the second raw material for producing a powder of indium-tin oxide aciculae or as the second intermediate powder of aciculae.

The raw material for producing a powder of indium-tin oxide aciculae and the powder of indium-tin hydroxide aciculae mentioned above are calcined in air, in vacuum or in an inert gas, at a temperature of 300° C. or higher, preferably 500° C. or higher, for 30 minutes to one hour or so to give a powder of indium oxide aciculae having a length of 5 $\mu$m or more and a ratio of length to the cross-sectional of 5 or more.

The first and second raw materials for producing a powder of indium-tin oxide aciculae and the first and second intermediates of powdery aciculae, which are obtained by the present invention, each are mixed with a solution of a tin salt, for example, stannous chloride or stannic chloride, then neutralized with an alkali, subjected to solid-liquid separation, dried, and calcined in air at 700° C., for example 1200° C., for about one hour, and optionally subjected to reduction by additionally calcining them in a nitrogen gas atmosphere containing ethanol gas at 300° to 400° C. for about 30 minutes, whereupon a powder of indium-tin oxide (ITO) aciculae still completely having the original needle-like form is obtained.

The first and second intermediates of powdery aciculae may be coated with a tin compound. For the coating, for example, the intermediates may be put in an aqueous solution of a tin halide (e.g., $SnCl_2$, $SnCl_4$), neutralized, subjected to solid-liquid separation and dried, whereupon tin hydroxide is precipitated and coated in and on the inside and the surface of these intermediates. Alternatively, these intermediates may be put in an aqueous or alcoholic solution of a tin compound and thereafter water or alcohol may be removed by vaporization to complete the intended coating.

The first and second intermediates of powdery aciculae and those coated with a tin compound, which are obtained in the present invention, both are converted into a powder of indium-tin oxide aciculae having a length diameter of 5 $\mu$m or more and a ratio of length to cross-sectional diameter of 5 or more by calcination, while completely maintaining their original needle-like form. By thermal analysis, it has been found that the first intermediate powder of aciculae rapidly releases NOx at 230° to 250° C. to be converted into a powder of indium-tin oxide aciculae. As mentioned above, the powdery aciculae that have been washed with an alkaline water are free from the rapid change and the decrease in their weight by calcination is small, but the same oxides are obtained.

The first and second intermediates of powdery aciculae are converted into a powder of indium oxide aciculae by calcination. The aciculae of the indium oxide powder may be coated with a tin compound capable of being converted into $SnO_2$ by calcination in the same manner as mentioned above, and the coated aciculae may be calcined to give a powder of indium-tin oxide aciculae.

The calcination may be effected anyway in air, in an inert gas or in vacuum. Where it is effected in an inert gas or in vacuum, oxygen voids may be trapped in the formed indium oxide due to thermal decomposition resulting from the calcination to give a low-resistance powder of indium-tin oxide aciculae. If desired, after the calcination is effected in air, the treatment may be effected so as to also give such a low-resistance powder of indium-tin oxide aciculae. The temperature for the calcination must be about 500° C. or higher, preferably 700° C. or higher. Where tin hydroxide is coated over the powdery aciculae it may be converted into $SnO_2$ only by the thermal calcination. Where $SnCl_2$ is coated over them, it is converted into $SnO_2$ by calcining the coated aciculae in an oxygen-containing atmosphere. $SnO_2$ thus formed is introduced into the crystals of $In_2O_3$ as a solid solution to give ITO.

The electroconductive paste of the present invention contains a fine powder of indium-tin oxide aciculae in a resin and its solvent. The fine powder of indium oxide aciculae (having a length of 5 $\mu$m or more and an axial ratio of 5 or more) to be in the paste is one that has been prepared by any of the above-mentioned methods. The pellets to be formed by pelletizing the powder obtained by any of the above-mentioned methods, under pressure of 100 kgf/cm2, have a specific resistance (hereinafter referred to as a green compact resistance) of about 0.03 $\Omega$.cm.

The fine powdery indium-tin oxide aciculae to be in the electroconductive paste of the present invention have an axial ratio of 5 or more. This is because the paste may have satisfactory electroconductivity even when it contains a small amount of the powder in a resin. If the aspect ratio is less than 5, it is impossible to make the specific resistance of the light-transmitting electroconductive film, which is derived from the paste, 1.0 $\Omega$.cm or less, when the content by volume of the electroconductive filler is 25% or less in the film. The aspect ratio is desired to be higher, preferably 10 or more. The fine powdery indium-tin oxide aciculae to be in the paste have a major diameter of 5 $\mu$m or more. This is because of the following reasons: The larger the major diameter, the smaller the number of the contact points between the aciculae, with the result that a film having a lower resistance may be obtained. For instance, in dispersion-containing EL devices, the fluorescent layer on which the paste is coated to form an electroconductive film thereon contains zinc sulfide particles having a diameter of from 5 to 30 $\mu$m and the surface of the fluorescent layer is rough to have thereon small hills or hollows in an order of about several $\mu$m. When the paste containing the fine powdery aciculae of the present invention having a major diameter of 5 $\mu$m or more is applied to the surface of the fluorescent layer in such an EL device, the contact between the aciculae is still maintained even in the coated film so that the film may have the necessary electroconductivity. However, if the aciculae have a major diameter of 100 $\mu$m or more, they will be difficult to pass through the meshes of the screen when the paste containing them is coated by screen printing and will therefore be obstacles to the printing operation. In general, the aciculae are desired to have a length of less than 100 $\mu$m. However, the definition shall not apply to a rough screen of an order of 100 meshes or less.

Though the electroconductive paste of the present invention contains a filler comprising relatively large aciculae, it may be printed by screen printing to form lines having a width of about 200 $\mu$m or so.

As the resin to be employed in the present invention, mentioned are thermoplastic resins, thermosetting resins, ultraviolet-hardening resins, etc., such as those to be employed in forming conventional light-transmitting electroconductive films. The ratio by weight of the fine powder of indium-tin oxide aciculae to the resin in the paste is defined to fall within the range of from 60:40 to 80:20. This is because if the resin content is larger than the defined ratio of 60:40, the resistance of the light-transmitting electroconductive film to be formed from the paste will be too high, but if it is smaller than the defined ratio of 80:20, the mechanical strength of the film will be lowered and the resistance thereof will be high.

The resistance of the light-transmitting electroconductive film to be formed from the paste somewhat varies, depending on the substrate on which the electroconductive paste is coated. For instance, the paste coated on a polyester film generally gives a film having a lower resistance than that coated on a glass substrate.

In place of the above-mentioned resin, a glass frit that has passed through a sieve with from 300 to 500 meshes-may be employed. The kind of the glass frit to be employed is not specifically defined but may be selected in accordance with the baking temperature. Where the baking temperature is from 500° to 600° C., for example, a $PbO-B_2O_3-SiO_2$ glass having a relatively low melting point may be employed. However, if the film is formed on the fluorescent layer of an EL device, a glass of such a kind that does not react with zinc sulfide (ZnS) in the fluorescent layer shall be selected. The $PbO-B_2O_3-SiO_2$ glass is not preferred for the case, since PbO in the glass reacts with ZnS. For EL devices, for example, a PbO-free glass such as $Na_2O-B_2O_3-ZnO$ glass may be used.

The ratio by volume of the fine powder of indium-tin oxide aciculae to the glass frit in the paste is defined to fall within the range of from 10:90 to 50:50. This is because of the following reasons: If the glass content in the paste is larger than the defined ratio of 10:90, the resistance of the light-transmitting electroconductive film to be formed will be too high, but if it is smaller than the defined ratio of 50:50, the mechanical strength of the film will be lowered and the resistance thereof will be high. The ratio of the fine powder of indium-tin oxide aciculae to the glass frit in the paste is by volume. This is because the specific gravity of the glass frit greatly varies within the range of from 2 to 6, depending on the kind of itself. On the contrary, however, when a resin is used as the binder, the ratio of the powder oxide aciculae to the resin may be either by weight or by volume without causing any significant problem, since the resin generally has a specific gravity of from 1.1 to 1.3.

Before the paste is printed by screen printing, a viscosity-increasing agent (thickener or tackifier) is added to the paste so as to suitably adjust the viscosity of the paste. As the agent, for example, usable are cellulose materials such as methyl cellulose, ethyl cellulose, etc., as well as resins such as acrylic resins, etc. The agent may be anyone that is fired and removed by baking. In addition to the above, therefore, any others which are hardened in the same manner may also be employed.

As the solvent for forming the paste, employable are any organic solvents which are used in producing ordinary coating pastes. Water is also usable. As usable organic solvents, for example, mentioned are ketone solvents such as cyclohexanone, isophorone, diacetone-alcohol, etc.; alcohol solvents such as methyl alcohol, ethyl alcohol, isopropyl alcohol, etc.; ester solvents such as ethyl acetate, butyl acetate, etc.; and cellosolve, butyl cellosolve, butyl carbitol, N,N-dimethylformamide, etc. However, these are not limitative.

The temperature at which the coated film is baked is preferably not lower than the softening point of the glass frit contained in the paste. If it is lower than the softening point thereof, the fluidity of the binder of the glass frit will be insufficient so that a film having a sufficient mechanical strength cannot be formed.

The baking of the coated film may be effected in air. It may also be effected in an inert gas or in a weakly reducing atmosphere. In this case, air voids are introduced into the ITO aciculae to give a baked film having a lower resistance than that baked in air. However, oxygen is needed for firing cellulose materials and resins, which are components constituting ordinary viscosity-increasing agents. Therefore, it is necessary that the atmosphere is changed to an inert gas atmosphere or a weakly reducing atmosphere after the components of the viscosity-increasing agent existing in the coated film have been completely fired out.

Of the light-transmitting electroconductive film of the present invention, one comprising a fine powder of indium-tin oxide aciculae and a resin is defined to have a specific resistance of 1.0 $\Omega$.cm or less and the content of the fine powder of indium-tin oxide aciculae in the film is defined to be 25% by volume or less. This is because of the following reasons: Comparing the light-transmitting electroconductive film of the present invention, which comprises a fine powder of indium-tin oxide aciculae and a resin, and a conventional electroconductive film containing a conventional ultra-fine powder of ITO as the electroconductive filler, the optimum ratio by weight of the fine powder of indium-tin oxide aciculae to the resin in the former is within the range of from 60:40 to 80:20, preferably from 65:35 to 70:30, since the former film of the present invention contains a fine powder of indium-tin oxide aciculae having a high aspect ratio as the electroconductive filler, while the ratio by weight of the ITO powder to the resin in the latter conventional film containing a conventional ultra-fine powder of ITO is within the range of approximately from 85:15 to 90:10. For these reasons, the content by volume of the fine powder of indium-tin oxide aciculae in the light-transmitting electroconductive film of the present invention may be 25% by volume or less in order to make the specific resistance of the film 1.0 $\Omega$.cm or less. Since the thickness of the electroconductive film of the present invention may be larger than that of the conventional electroconductive film, the surface resistance of the film of the present invention may be lowered.

In the other one comprising a fine powder of indium-tin oxide aciculae and a glass, the aciculae are defined to have an axial ratio of 5 or more. This is because the film to be formed from the paste may have sufficient electroconductivity even though the content of the fine powder may be small relative to the glass content. If the axial ratio of the indium-tin oxide aciculae in the film is less than 5, it is impossible to make the specific resistance of the film 5.0 $\Omega$.cm or less.

Comparing the optical characteristics of the light-transmitting electroconductive film of the present invention and those of the conventional films containing a conventional ultra-fine powder of ITO, the film of the present invention greatly scatters light since it has an extremely high haze value of about 90% or so, with the result that it has a low transmittance of complete light of from 50 to 80%. However, when it is used as the light-transmitting electroconductive film, for example, in EL devices, its light transmittance does not simply reflect the luminance of EL devices. The reason why the light-transmitting electroconductive film of the present invention has a low light transmittance is not because the film greatly absorbs light but because it scatters much amount of the incident rays applied thereto due to its high haze. For the luminance of EL devices, the absorption of light by the ITO element shall be taken into consideration rather than the amount of light scattering on the element.

It is considered that the smaller the amount of the fine powder of indium-tin oxide aciculae in the film, the smaller the amount of light to be absorbed by the film. Therefore, the light-transmitting electroconductive film of the present invention containing a small amount of a fine powder of indium-tin oxide aciculae but having a low resistance may have a high luminance, though it has a low light transmittance measured.

The present invention will be explained in more detail by means of the following examples, which, however, are not intended to restrict the scope of the present invention.

EXAMPLE 1

50.2 g of a liquid containing 500 g/liter of In and 760 g/liter of $NO_3^-$ and having a liquid specific gravity of 1.93, that had been obtained by dissolving an indium metal in nitric acid, were heated and concentrated, while stirred on a hot stirrer. With concentration, the temperature of the liquid rose, the liquid gave white fumes, and the amount of the liquid gradually decreased. After heated up to about 144° C., the liquid became cloudy to be an extremely thick slurry. Afterwards, the heating was stopped at the liquid temperature of about 144° C. The weight of the slurry was 36.6 g, and 13.6 g of nitric acid and water, etc. were vaporized out during the concentration. The slurry was gradually cooled, and after it became at about 70° C., 2 liters of water were added to the whole of the slurry and stirred whereby the thick liquid in the slurry was diluted with water. Immediately after the addition, this was filtered, washed with pure water and ethanol in order and dried at 120° C. to obtain 2.3 g of a first raw material for producing a powder of indium-tin oxide aciculae. From analysis of the powdery aciculae thus obtained, it was found that the In content therein was 57.4% by weight and the $NO_3^-$ content was 20.2% by weight. FIG. 1 is an electromicroscopic photograph showing the crystal structure of the product.

EXAMPLE 2

Figure 2:
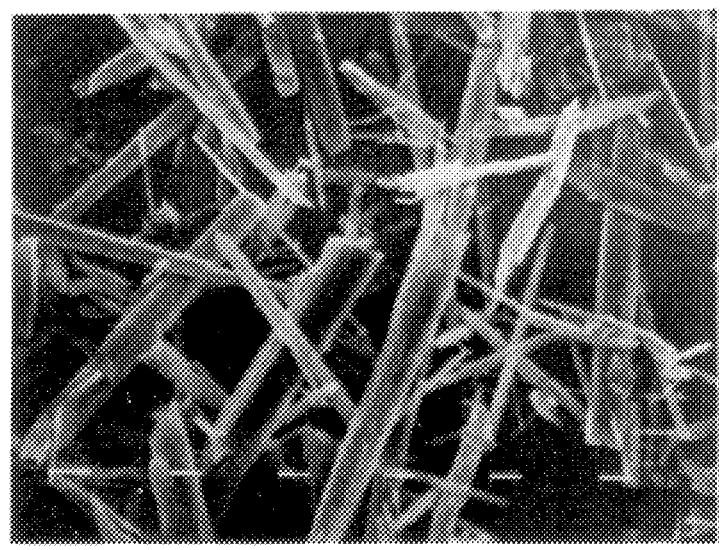
FIG. 2 is an electromicroscopic photograph showing the crystal structure of the first raw material for producing a powder of indium-tin oxide aciculae, that was obtained in Example 2 of the present invention.

20.0 g of gel-like indium hydroxide [$In(OH)_3$: 33% by weight, $H_2O$: 67% by weight] were added to 200.4 g of a liquid containing 500 g/liter of In and 760 g/liter of $NO_3^-$ and having a liquid specific gravity of 1.93, that had been obtained by dissolving an indium metal in nitric acid, and concentrated under heat while stirred on a hot stirrer. With concentration, the liquid gradually became transparent, and the heating was stopped when the liquid became transparent at about 137° C. Then, the liquid was cooled extremely gradually while it was on the hot stirrer. With cooling, the liquid gradually became cloudy and the precipitation of powdery aciculae in the liquid was ascertained. Finally, the weight of the slurry was 158.8 g, and 61.2 g of nitric acid and water were evaporated out during the concentration. 8 liters of water were added to the whole slurry thus obtained and stirred whereby the thick liquid in the slurry was diluted with water. Immediately after the addition, this was filtered, washed with pure water and ethanol in order and dried at 120° C. to obtain 10.0 g of a first raw material for producing a powder of indium-tin oxide aciculae. From analysis of the powdery aciculae thus obtained, it was found that the In content therein was 62.1% by weight and the $NO_3^-$ content was 12.5% by weight. FIG. 2 is an electromicroscopic photograph showing the crystal structure of the product.

EXAMPLE 3

Figure 3:
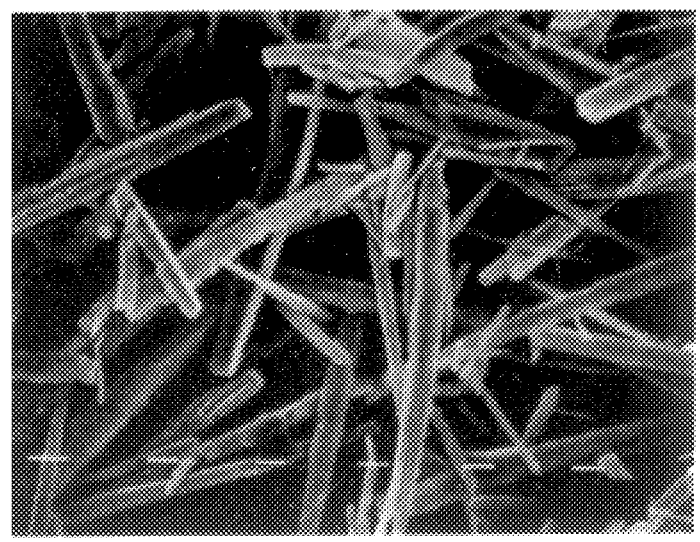
FIG. 3 is an electromicroscopic photograph showing the crystal structure of the first raw material for producing a powder of indium-tin oxide aciculae, that was obtained in Example 3 of the present invention.

10.0 g of gel-like indium hydroxide [$In(OH)_3$: 33% by weight, $H_2O$: 67% by weight] were added to 100 g of a liquid containing 500 g/liter of In and 760 g/liter of $NO_3^-$ and having a liquid specific gravity of 1.93, that had been obtained by dissolving an indium metal in nitric acid, and concentrated under heat while stirred on a hot stirrer. With concentration, the liquid gradually became transparent, and the heating was stopped when the liquid became transparent at about 136° C. Then, the hot stirrer was removed from the liquid, which was then gradually cooled. With cooling, the liquid gradually became cloudy and the precipitation of powdery aciculae in the liquid was ascertained. Finally, the weight of the slurry was 81.4 g, and 28.6 g of nitric acid and water were evaporated out during the concentration. 4 liters of water were added to the whole slurry thus obtained and stirred whereby the thick liquid in the slurry was diluted with water. Immediately after the addition, this was filtered, washed with pure water and ethanol in order and dried at 120° C. to obtain 3.0 g of a first raw material for producing a powder of indium-tin oxide aciculae. From analysis of the powdery aciculae thus obtained, it was found that the In content therein was 65.5% by weight and the $NO_3^-$ content was 9.3% by weight. FIG. 3 is an electromicroscopic photograph showing the crystal structure of the product.

EXAMPLE 4

Figure 4:
FIG. 4 is an electromicroscopic photograph showing the crystal structure of the first raw material for producing a powder of indium-tin oxide aciculae, that was obtained in Example 4 of the present invention.

40.0 g of gel-like indium hydroxide [$In(OH)_3$: 33% by weight, $H_2O$: 67% by weight] were added to 200 g of a liquid containing 500 g/liter of In and 760 g/liter of $NO_3^-$ and having a liquid specific gravity of 1.93, that had been obtained by dissolving an indium metal in nitric acid, and concentrated under heat while stirred on a hot stirrer. Afterwards, when the liquid became almost transparent at about 136° C., the heating was stopped. Then, the hot stirrer was removed from the liquid, which was then gradually cooled. Finally, the weight of the slurry was 179.6 g, and 60.4 g of nitric acid and water were evaporated out during the concentration. 137.8 g of the thus-obtained slurry was subjected to centrifugal filtration to obtain 51.4 g of a filtered cake and 86.4 g of a concentrated thick liquid. Prior to the centrifugal filtration, the centrifugal filter was pre-heated at about 80° C. and the slurry that had been heated at about 70° C. was applied thereto. The centrifugal filtration was effected at 3000 rpm and 1500 G for 4 minutes. 2 liters of water were added to the whole-of the filtered cake thus obtained and stirred, whereby the thick liquid adhered to the cake was diluted. Immediately after the addition, this was filtered, washed with pure water and ethanol in order and dried at 120° C. to obtain 3.6 g of a first raw material for producing a powder of indium-tin oxide aciculae. From analysis of the powdery aciculae thus obtained, it was found that the In content therein was 65.5% by weight and the $NO_3^-$ content was 9.3% by weight. FIG. 4 is an electromicroscopic photograph showing the crystal structure of the powdery aciculae.

EXAMPLE 5

Figure 5:
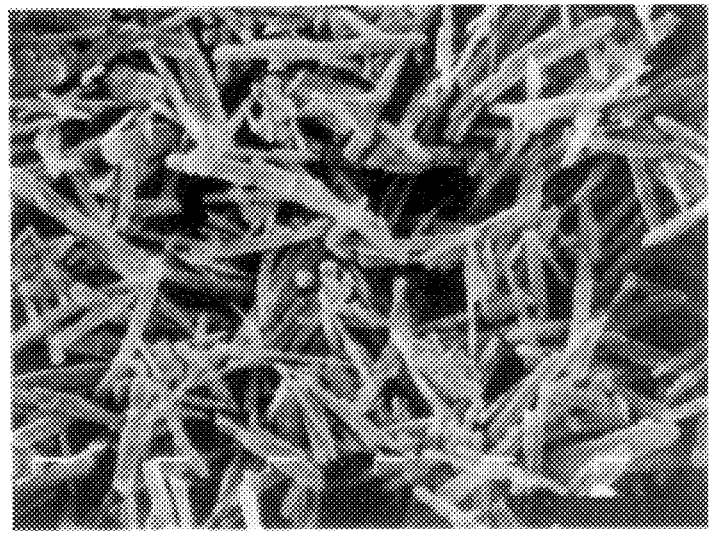
FIG. 5 is an electromicroscopic photograph showing the crystal structure of the first raw material for producing a powder of indium-tin oxide aciculae, that was obtained in Example 5 of the present invention.

20 g of lithium nitrate and 20 g of water were added to 10 g of a liquid containing 440 g/liter of In and 770 g/liter of $NO_3^-$ and having a liquid specific gravity of 1.87, that had been obtained by dissolving an indium metal in nitric acid, and heated and concentrated, while stirred on a hot stirrer. With concentration, the temperature of the liquid rose, the liquid gave white fumes, and the amount of the liquid gradually decreased. After heated up to about 139° C., the liquid became cloudy to be an extremely thick slurry. Afterwards, the heating was stopped at the liquid temperature of about 161° C. The weight of the slurry was 26.6 g, and 23.4 g of nitric acid and water, etc. were vaporized out during the concentration. The slurry was gradually cooled, and 300 ml of water were added to the whole of the slurry and stirred whereby the thick liquid in the slurry was diluted with water. Immediately after the addition, this was filtered, washed with pure water and ethanol in order and dried at 120° C. to obtain 1.75 g of a first raw material for producing a powder of indium-tin oxide aciculae. (46.2% of the indium in the liquid was recovered as the needle-like crystals.) From analysis of the powdery aciculae thus obtained, it was found that the In content therein was 62.1% by weight, the $NO_3^-$ content was 12.5% by weight and the Li content was less than 0.01% by weight. FIG. 5 is an electromicroscopic photograph showing the crystal structure of the product.

EXAMPLE 6

Figure 6:
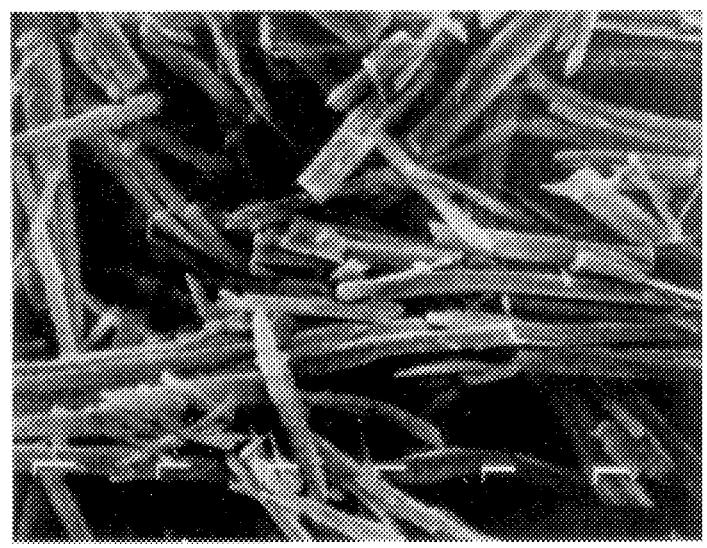
FIG. 6 is an electromicroscopic photograph showing the crystal structure of the first raw material for producing a powder of indium-tin oxide aciculae, that was obtained in Example 6 of the present invention.

10 g of lithium nitrate, 10 g of sodium nitrate and 20 g of water were added to 10 g of a liquid containing 440 g/liter of In and 770 g/liter of $NO_3^-$ and having a liquid specific gravity of 1.87, that had been obtained by dissolving an indium metal in nitric acid, and heated and concentrated, while stirred on a hot stirrer. With concentration, the temperature of the liquid rose, the liquid gave white fumes, and the amount of the liquid gradually decreased. After heated up to about 147° C., the liquid became cloudy to be an extremely thick slurry. Afterwards, the heating was stopped at the liquid temperature of about 180° C. The weight of the slurry was 25.5 g, and 24.5 g of nitric acid and water, etc. were vaporized out during the concentration. The slurry was gradually cooled, and 300 ml of water were added to the whole of the slurry and stirred whereby the thick liquid in the slurry was diluted with water. Immediately after the addition, this was filtered, washed with pure water and ethanol in order and dried at 120° C. to obtain 1.5 g of a first raw material for producing a powder of indium-tin oxide aciculae. (39.1% of the indium in the liquid was recovered as the needle-like crystals.) From analysis of the powdery aciculae thus obtained, it was found that the In content therein was 61.3% by weight, the $NO_3^-$ content was 11.3% by weight and the Li content was less than 0.01% by weight. FIG. 6 is an electromicroscopic photograph showing the crystal structure of the product.

EXAMPLE 7

Figure 7:
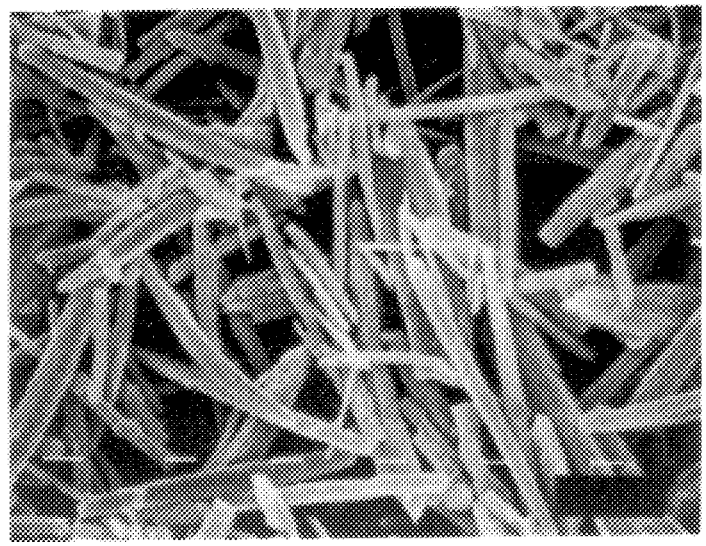
FIG. 7 is an electromicroscopic photograph showing the crystal structure of the powder of indium-tin oxide aciculae, that was obtained in Example 7 of the present invention.

The first raw material for producing a powder of indium-tin oxide aciculae, that had been obtained in Example 3, was put in an aqueous 2.5% ammonia, stirred, filtered, washed with pure water and ethanol in order and dried at 120° C. to obtain a second raw material for producing a powder of indium-tin oxide aciculae. This was considered indium hydroxide. From analysis of the powdery aciculae thus obtained, it was found that the In content therein was 69.3% by weight and the $NO_3^-$ content was less than 0.1% by weight. FIG. 7 is an electromicroscopic photograph showing the crystal structure of the powdery aciculae.

17

EXAMPLE 8

Figure 8:
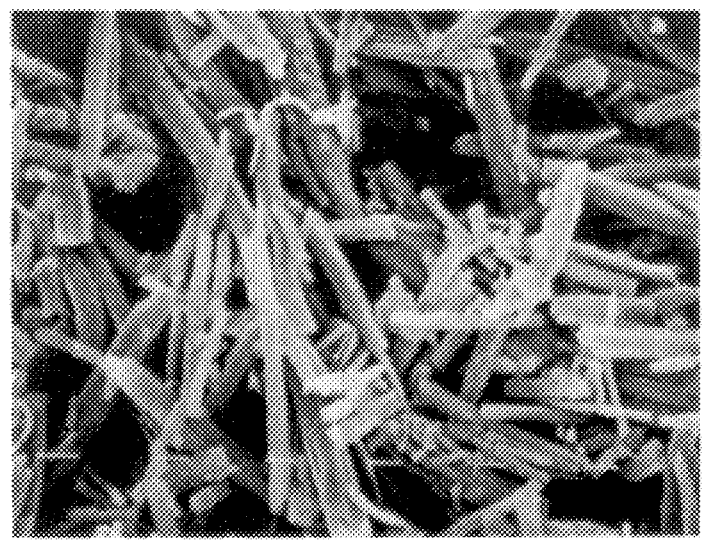
FIG. 8 is an electromicroscopic photograph showing the crystal structure of the powder of indium-tin oxide aciculae, that was obtained in Example 8 of the present invention.

The first raw material for producing a powder of indium-tin oxide aciculae, that had been obtained in Example 1, was calcined in air at 700° C. for 30 minutes to obtain a powder of indium oxide aciculae. FIG. 8 is an electromicroscopic photograph showing the crystal structure of the powdery aciculae.

COMPARATIVE EXAMPLE 1

Figure 9:
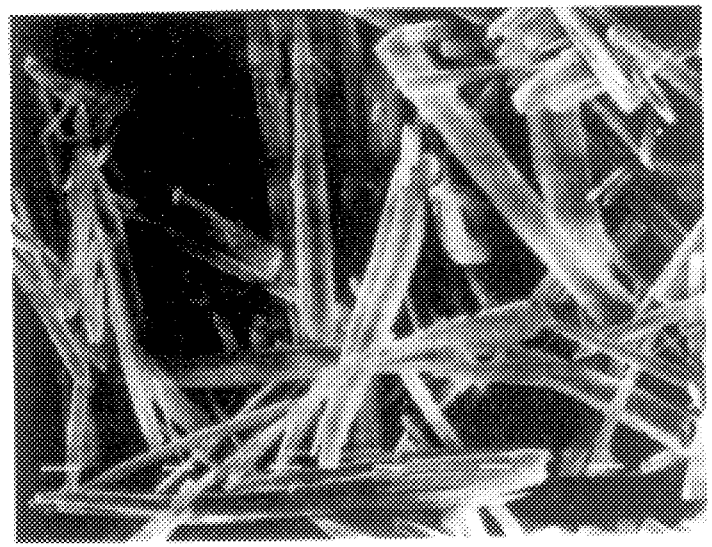
FIG. 9 is an electromicroscopic photograph showing the crystal structure of the powder of indium-tin oxide aciculae, that was obtained in Comparative Example 1.

A liquid that had been prepared by dissolving 0.08 g of tin tetrachloride hydrate ($SnCl_4 \cdot xH_2O$ with an $SnCl_4$ content of 76% by weight) in 80 cc of water was neutralized with an aqueous 1% ammonia. 2.0 g of the first raw material for producing a powder of indium-tin oxide aciculae, that had been prepared in the same manner as in Example 3, were added to the liquid, stirred for 10 minutes, filtered, washed and dried at 120° C. Afterwards, it was calcined in nitrogen gas at 700° C. for 30 minutes to obtain a powder of ITO aciculae. The thus-obtained powder of ITO aciculae had an Sn content of 1.2% by weight. The green compact resistance of the pellets formed from the powder (or the specific resistance of the pellets formed by pressing the powder under pressure of 100 kgf/cm$^2$) was 0.03 Ω.cm. FIG. 9 is an electromicroscopic photograph showing the crystal structure of the powdery aciculae of indium-tin oxide.

COMPARATIVE EXAMPLE 2

The same process as in Example 5 was repeated, except that anyone of (a) 20 g of sodium nitrate, (b) 20 g of potassium nitrate, (c) 20 g of calcium nitrate, (d) 20 g. of ammonium nitrate, and (e) 10 g of sodium nitrate and 10 g of potassium nitrate was used in place of 20 g of lithium nitrate. In all these cases (a) to (e), no needle-like crystals were obtained, or if obtained, the yield thereof was 0.2 g or less and was extremely low.

EXAMPLE 9

Figure 10:
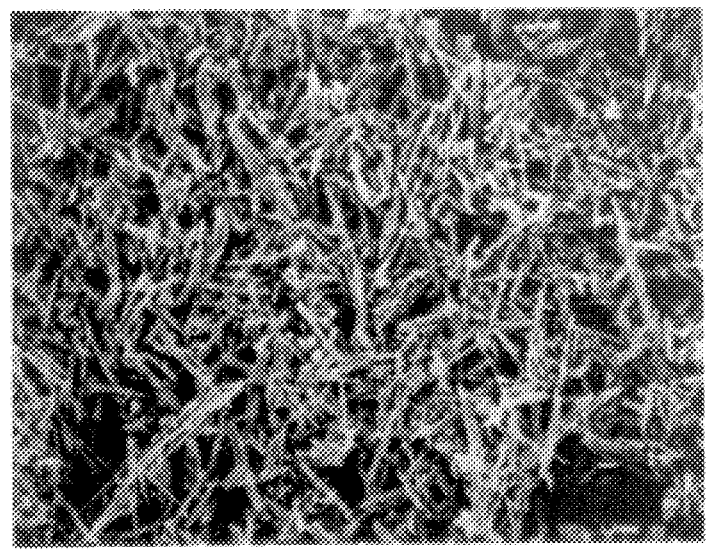
FIG. 10 is an electromicroscopic photograph showing the crystal structure of the powder of indium-tin oxide aciculae, that was obtained in Example 9 of the present invention.
Figure 11:
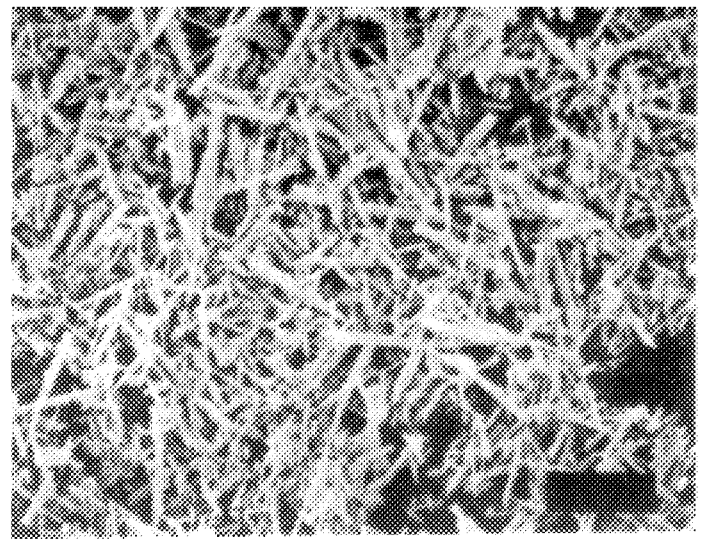
FIG. 11 is an electromicroscopic photograph showing the crystal structure of the first intermediate powder of aciculae, that was obtained in Example 9 of the present invention.

98 g of tin tetrachloride hydrate ($SnCl_4 \cdot xH_2O$ with an anhydrous $SnCl_4$ content of 76% by weight) were dissolved in 1504 g of a liquid containing 500 g/liter of In and 760 g/liter of $NO_3^-$ and having a liquid specific gravity of 1.93, that had been obtained by dissolving an indium metal in nitric acid, and concentrated under heat while stirred. With concentration, the temperature of the liquid rose, the liquid gave white fumes, and the amount of the liquid gradually decreased. After heated up to about 150° C., the liquid became cloudy to be an extremely thick white slurry. The heating was stopped at the liquid temperature of about 150° C. The weight of the slurry thus formed was 1016 g, and 580 g of nitric acid and water, etc. were vaporized out during the concentration. The slurry was gradually cooled. After it became at about 70° C., and 50 liters of water were added to the whole of the slurry and stirred whereby the thick liquid in the slurry was diluted with water. Immediately after the addition, this was filtered, washed with pure water and ethanol in order and dried at 120° C. to obtain 21.7 g of a first intermediate powder of aciculae. From analysis of the first intermediate powder of aciculae thus obtained, it was found that: the In content therein was 62.0% by weight, the Sn content was 1.3% by weight and the $NO_3^-$ content was 9.4% by weight. 5 g of the powder were calcined in nitrogen gas at 700° C. for 30 minutes to obtain 3.8 g of a powder of indium-tin oxide aciculae. FIG. 10 is an electromicroscopic photograph showing the crystal structure of the powdery indium-tin oxide aciculae; and FIG. 11 is an electromicroscopic photograph showing the crystal structure of the aciculae of the first intermediate powder.

EXAMPLE 10

Figure 12:
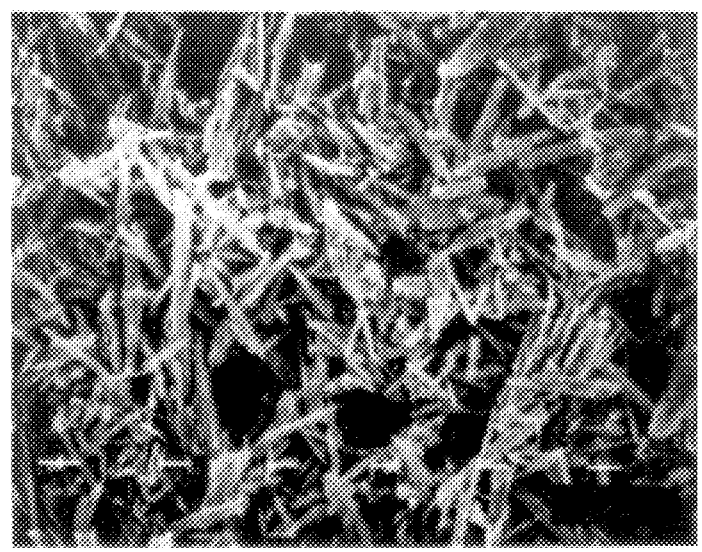
FIG. 12 is an electromicroscopic photograph showing the crystal structure of the powder of indium-tin oxide aciculae, that was obtained in Example 10 of the present invention.

5 g of the first intermediate powder of aciculae, that had been obtained in Example 9, were washed with an aqueous 2.5% ammonia to obtain a second intermediate, powder of aciculae. This was calcined in nitrogen gas at 700° C. for 30 minutes to obtain 3.8 g of a powder of indium-tin oxide aciculae. FIG. 12 is an electromicroscopic photograph showing the crystal structure of the powdery indium-tin oxide aciculae.

EXAMPLE 11

Figure 13:
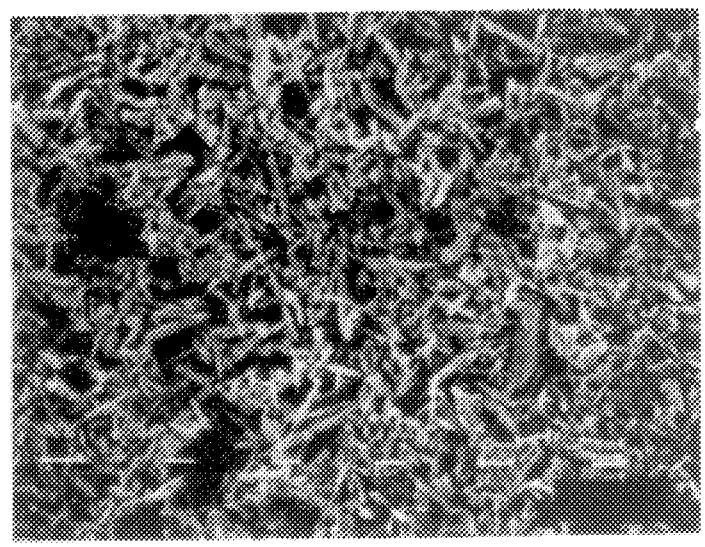
FIG. 13 is an electromicroscopic photograph showing the crystal structure of the powder of indium-tin oxide aciculae, that was obtained in Example 11 of the present invention.

One kg of a slurry containing a first intermediate powder of aciculae were obtained under the same conditions as those in Example 9. Without cooling, this was subjected to high-pressure filtration to separate the thick solution from the slurry. The high-pressure filtration was effected at about 150° C. under pressure of 4 kgf/cm$^2$, using a glass fiber filter (GT-100, made by Advantex Co.), by which 315 g of a filtered cake and 673 g of a thick filtrate were obtained. Subsequently, 15 liters of water were added to the whole amount of the filtered cake and stirred, whereby the thick liquid remained and adhered to the filtered cake was diluted with water. Immediately after the addition, this was filtered, washed with pure water and ethanol in order and dried at 120° C. to obtain 28 g of a first intermediate powder of aciculae. 20 g of the powder was calcined in air at 700° C. for one hour so as to lower its resistance, and 15.1 g of a powder of indium-tin oxide aciculae were obtained. FIG. 13 is an electromicroscopic photograph showing the crystal structure of the powdery indium-tin oxide aciculae.

EXAMPLE 12

Figure 14:
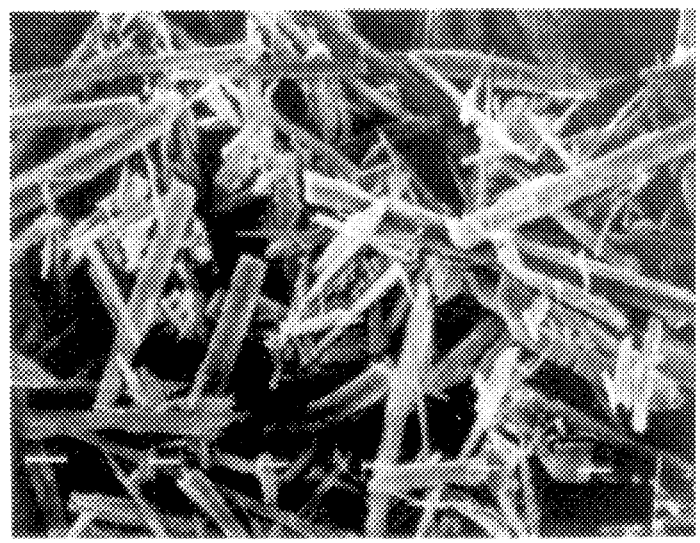
FIG. 14 is an electromicroscopic photograph showing the crystal structure of the powder of indium-tin oxide aciculae, that was obtained in Example 12 of the present invention.
Figure 15:
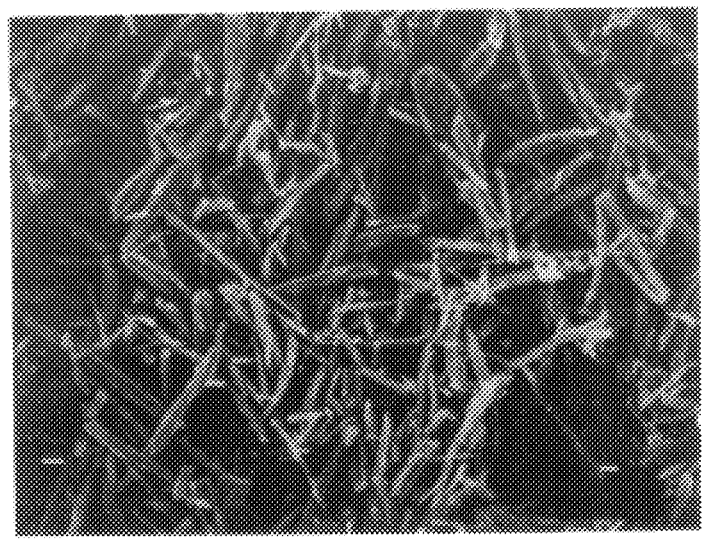
FIG. 15 is an electromicroscopic photograph showing the crystal structure of the powder of indium-tin oxide aciculae, that was obtained in Example 14 of the present invention.

101 g of gel-like indium hydroxide [$In(OH)_3$: 33% by weight, $H_2O$: 67% by weight] and 25 g of tin tetrachloride hydrate ($SnCl_4 \cdot xH_2O$ with an anhydrous $SnCl_4$ content of 76% by weight) were added to 500 g of a liquid containing 500 g/liter of In and 760 g/liter of $NO_3^-$ and having a liquid specific gravity of 1.93, that had been obtained by dissolving an indium metal in nitric acid, and concentrated under heat while stirred. With concentration, the liquid became completely transparent. With further concentration, it gradually became cloudy to give a first intermediate of white powdery aciculae precipitated therein. The concentration was stopped when the liquid temperature became 137° C. The weight of the slurry thus formed was 432 g, and 194 g of nitric acid and water were vaporized out during the concentration. 20 liters of water were added to the whole of the thus-obtained slurry and stirred whereby the thick liquid in the slurry was diluted with water. Immediately after the addition, this was filtered, washed with pure water and ethanol in order and dried at 120° C. to obtain 3.0 g of a first intermediate powder of aciculae. This was calcined in nitrogen gas at 700° C. for 30 minutes to obtain 2.3 g of a powder of indium-tin oxide aciculae. FIG. 14 is an electromicroscopic photograph showing the crystal structure of the powdery aciculae.

EXAMPLE 13

93 g of gel-like indium hydroxide [$In(OH)_3$: 33% by weight, $H_2O$: 67% by weight] and 22 g of tin dichloride (anhydrous $SnCl_2$) were added to 500 g of a liquid containing 500 g/liter of In and 760 g/liter of $NO_3^-$ and having a liquid specific gravity of 1.93, that had been obtained by dissolving an indium metal in nitric acid, and concentrated under heat while stirred. The liquid gave much NOx by heating with the result that it became brown. After the concentration was continued for a while, the generation of NOx ceased and the liquid again became transparent. The generation of NOx was considered because of the reducing action of the divalent tin ions. With further concentration, the liquid gradually became transparent, and the concentration under heat was continued until the liquid temperature became 137° C. The weight of the thus-concentrated slurry was 525 g, and 90 g of nitric acid and water were vaporized out during the concentration. 20 liters of water were added to the whole of the thus-obtained slurry and stirred whereby the thick liquid in the slurry was diluted with water. Immediately after the addition, this was filtered, washed with pure water and ethanol in order and dried at 120° C. to obtain 5.2 g of a first intermediate powder of aciculae. This was calcined in air at 700° C. for one hour and then subjected to treatment for lowering its resistance to obtain 3.9 g of a powder of indium-tin oxide aciculae.

EXAMPLE 14

181 g of indium hydroxide containing tin (In(OH)$_3$+Sn(OH)$_4$=21% by weight; H$_2$O=79% by weight; In/Sn by weight=10), that had been obtained by neutralizing a solution comprising indium nitrate and tin tetrachloride with aqueous ammonia followed by co-precipitating both indium hydroxide and tin hydroxide, were added to 500 g of a liquid containing 500 g/liter of In and 760 g/liter of NO$_3^-$ and having a liquid specific gravity of 1.93, that had been obtained by dissolving an indium metal in nitric acid, and concentrated under heat while stirred. With concentration, the liquid gradually became transparent, and the concentration under heat was continued until the liquid temperature became 130° C. The weight of the thus-concentrated slurry was 448 g, and 233 g of nitric acid and water were vaporized out during the concentration. 20 liters of water were added to the whole of the thus-obtained slurry and stirred whereby the thick liquid in the slurry was diluted with water. Immediately after the addition, this was filtered, washed with pure water and ethanol in order and dried at 120° C. to obtain 23 g of a first intermediate powder of aciculae. This was calcined in air at 700° C. for one hour and then subjected to treatment for lowering its resistance to obtain 17 g of a powder of indium-tin oxide aciculae. FIG. 5 is an electromicroscopic photograph showing the crystal structure of the powdery indium-tin oxide aciculae.

Figure 16:
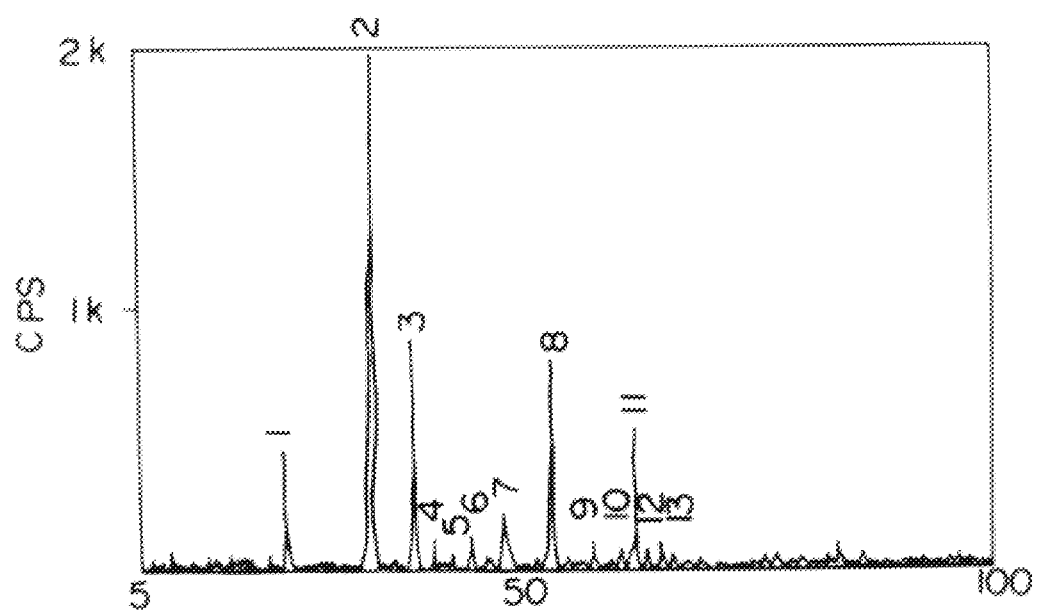
FIG. 16 shows the patterns of X-ray diffraction of the powders of indium-tin oxide aciculae that were produced in Examples 9 to 14 of the present invention.

The powders of indium-tin oxide aciculae that had been obtained in the above-mentioned Examples 9 to 14 were subjected to X-ray diffraction to identify the presence of In$_2$O$_3$ therein, with the result that they gave the peaks 1 to 13 of In$_2$O$_3$ shorn in FIG. 16, like the standard sample of In$_2$O$_3$. From the results, they were identified to comprise In$_2$O$_3$. As shown in Table 1 below which indicates the data of analysis of the powders, the powders contained tin. However, since tin was in the powders in the form of its solid solution, it gave no peak in the patterns of the X-ray diffraction of the powders. Table 1 shows the tin content in the powders of indium-tin oxide aciculae obtained in the above-mentioned Examples 9 to 14 along with the green compact resistance values of the powders. The green compact resistance value means the specific resistance of the green compact of the powder that had been prepared by pressing the powder under pressure of 100 kgf/cm$^2$.

TABLE 1

| Example | Tin Content (% by weight) | Specific Resistance (Ω · cm) |
|---------|---------------------------|------------------------------|
| 9       | 1.7                       | 0.03                         |
| 10      | 1.7                       | 0.03                         |
| 11      | 1.7                       | 0.04                         |
| 12      | 1.3                       | 0.04                         |
| 13      | 2.9                       | 0.03                         |
| 14      | 0.8                       | 0.06                         |

EXAMPLE 15

8.5 kg of a liquid containing 200 g/liter of In and 304 g/liter of NO$_3^-$ and having a liquid specific gravity of 1.23, that had been obtained by dissolving an indium metal in nitric acid, were heated and concentrated, while stirred on a hot stirrer. With concentration, the temperature of the liquid rose, the liquid gave white fumes, and the amount of the liquid gradually decreased. After heated up to about 144° C., the liquid became cloudy to be an extremely thick slurry. Afterwards, the heating was stopped at the liquid temperature of about 147° C. The weight of the slurry was 2290 g, and 6210 g of nitric acid and water, etc. were vaporized out during the concentration. The slurry was gradually cooled, and after it became at about 110° C., 200 liters of water were added to the whole of the slurry and stirred whereby the thick liquid in the slurry was diluted with water. Immediately after the addition, this was filtered, washed with pure water and ethanol in order and dried at 120° C. to obtain 181 g of a first intermediate powder of aciculae. From analysis of the powdery aciculae thus obtained, it was found that the In content therein was 63.5% by weight and the NO$_3^-$ content was 9.6% by weight.

Next, 20 g of the powdery aciculae were put in an aqueous solution comprising 1.1 g of tin chloride hydrate (SnCl$_4$·xH$_2$O with an SnCl$_4$ content of 76% by weight), 400 g of water and 5 g of an aqueous 25% ammonia which was to prevent the hydrolysis of the powdery aciculae, and dispersed uniformly therein. 35 g of an aqueous 25% ammonia were added to the dispersion so as to neutralize it to have pH of 8 or more, and this was boiled under heat. Next, this was filtered to thereby separate the powdery aciculae coated with tin oxide from the liquid. The thus-coated aciculae were calcined in air at 1000° C. for one hour and then reduced under heat at 340° C. in nitrogen gas for 30 minutes to obtain a powder of indium-tin oxide aciculae.

Figure 17:
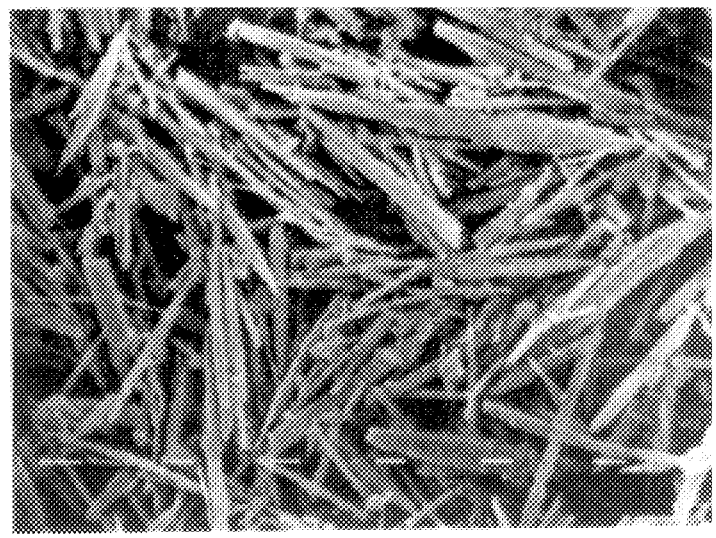
FIG. 17 is an electromicroscopic photograph showing the crystal structure of the powder of indium-tin oxide aciculae, that was obtained in Example 15 of the present invention.
Figure 18:
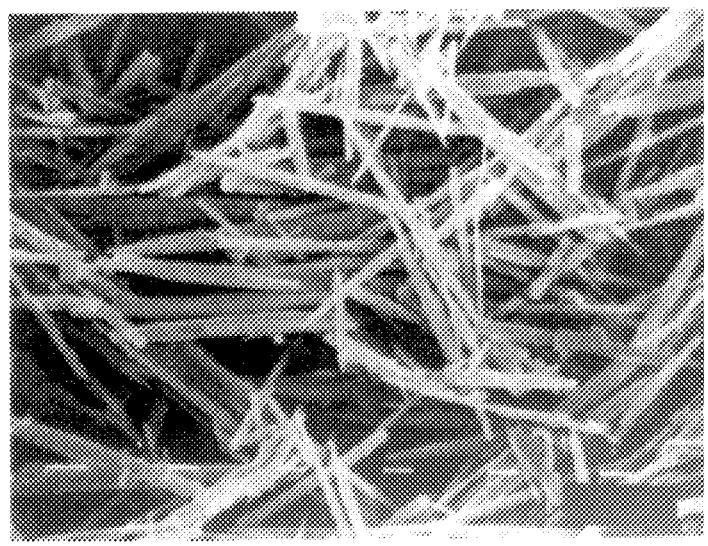
FIG. 18 is an electromicroscopic photograph showing the crystal structure of the first intermediate powder of aciculae, that was obtained in Example 15 of the present invention.
Figure 19:
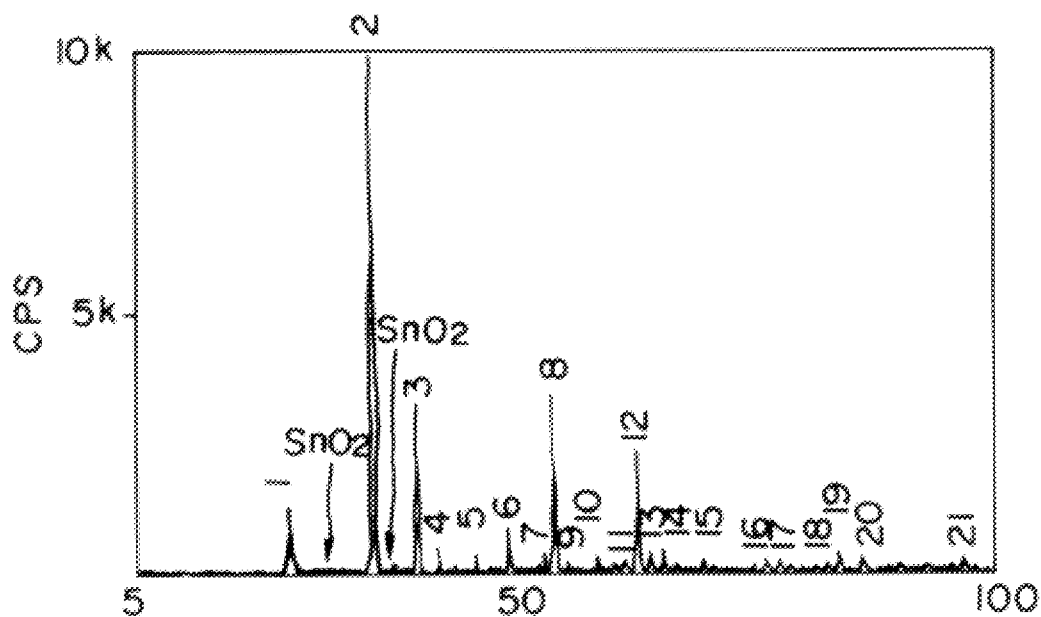
FIG. 19 shows the pattern of X-ray diffraction of the powder of indium-tin oxide aciculae, that was obtained in Example 15 of the present invention.

FIG. 17 is an electromicroscopic photograph showing the crystal structure of the thus-obtained powdery indium-tin oxide aciculae; and FIG. 18 is an electromicroscopic photograph showing the crystal structure of the aciculae of the first intermediate powder. The tin content in the powder of indium-tin oxide aciculae thus obtained was 2.3% by weight. The resistance (green compact resistance) of the green compact of the powder that had been prepared by pressing the powder under pressure of 100 kgf/cm$^2$ was 0.03 Ω.cm. The powder was subjected to X-ray diffraction so as to identify it, giving the peaks 1 to 21 of In$_2$O$_3$ in the pattern of FIG. 19. In the powder, almost all Sn was in the form of its solid solution in In$_2$O$_3$ and gave no peak in the pattern. However, some SnO$_2$ that was not in the form of its solid solution gave some peaks.

EXAMPLE 16

20.0 g of gel-like indium hydroxide [In(OH)$_3$: 33% by weight, H$_2$O: 67% by weight] were added to 400.4 g of a liquid containing 500 g/liter of In and 760 g/liter of $NO_3^-$ and having a liquid specific gravity of 1.93, that had been obtained by dissolving an indium metal in nitric acid, and concentrated under heat while stirred on a hot stirrer. With concentration, the liquid became transparent, and the heating was stopped when the liquid became transparent at about 137° C. Then, the liquid was cooled extremely gradually while it was on the hot stirrer. With cooling, the liquid gradually became cloudy and the precipitation of powdery aciculae in the liquid was ascertained. The weight of the slurry thus obtained was 158.8 g, and 61.2 g of nitric acid and water were evaporated out during the concentration. 8 liters of water were added to the whole slurry thus obtained and stirred whereby the thick liquid in the slurry was diluted with water. Immediately after the addition, this was filtered, washed with pure water and ethanol in order and dried at 120° C. to obtain 10 g of a first intermediate powder of aciculae. From analysis of the powdery aciculae thus obtained, it was found that the In content therein was 57.4% by weight and the $NO_3^-$ content was 21.8% by weight.

5 g of the first intermediate powder of aciculae were put in a solution that had been prepared by dissolving 0.38 g of tin dichloride ($SnCl_2$) in 80 g of ethanol, and heated with stirring to vaporize the ethanol therefrom. The concentration of the slurry became high. When the slurry became creamy, it was transferred into a watch glass and dried therein to give a powder of aciculae coated with tin chloride. This was calcined in air at 1000° C. for one hour and then reduced under heat at 340° C. in nitrogen gas containing ethanol gas for 30 minutes to obtain a powder of indium-tin oxide aciculae. The tin content in the powdery aciculae was 6.1% by weight, and the green compact resistance of the powder was 0.03 Ω.cm.

EXAMPLE 17

40 g of gel-like indium hydroxide [$In(OH)_3$: 33% by weight, $H_2O$: 67% by weight] were added to 200 g of a liquid containing 500 g/liter of In and 760 g/liter of $NO_3^-$ and having a liquid specific gravity of 1.93, that had been obtained by dissolving an indium metal in nitric acid, and concentrated under heat while stirred on a hot stirrer. With concentration, the liquid became transparent, and the heating was stopped when the liquid became transparent at about 136° C. Then, the hot stirrer was removed from the liquid, which was then gradually cooled. Finally, the weight of the slurry was 179.6 g, and 60.4 g of nitric acid and water were evaporated out during the concentration. 137.8 g of the thus-obtained slurry was subjected to centrifugal filtration to obtain 51.4 g of a filtered cake and 86.4 g of a concentrated thick liquid. Prior to the centrifugal filtration, the centrifugal filter was pre-heated at about 80° C. and the slurry that had been heated at about 70° C. was applied thereto. The centrifugal filtration was effected at 3000 rpm and 1500 G for 4 minutes. 2 liters of water were added to the whole of the filtered cake thus obtained and stirred, whereby the thick liquid adhered to the cake was diluted. Immediately after the addition, this was filtered, washed with pure water and ethanol in order and dried at 120° C. to obtain 3.6 g of a first intermediate powder of aciculae. From analysis of the powdery aciculae thus obtained, it was found that the In content therein was 62.6% by weight and the $NO_3^-$ content was 9.8% by weight.

2.0 g of the powdery aciculae were coated with tin hydroxide and calcined in the same manner as in Example 14, and then reduced in the same manner as in Example 15 to obtain a powder of indium-tin oxide aciculae. The tin content in the powdery aciculae was 2.1% by weight, and the green compact resistance of the powder was 0.03 Ω.cm.

EXAMPLE 18

The first intermediate powder of aciculae that had been obtained in Example 15 was washed with aqueous ammonia to obtain a second intermediate powder of aciculae. The powdery aciculae thus obtained were coated with tin hydroxide in the same manner as in Example 15 and calcined in air at 1000° C. for one hour and then in nitrogen at 700° C. for 30 minutes to obtain a powder of indium-tin oxide aciculae. The tin content in the powdery aciculae was 2.1% by weight, and the green compact resistance of the powder was 0.03 Ω.cm.

EXAMPLE 19

The first intermediate powder of aciculae that had been obtained in Example 15 was calcined in air at 500° C. for one hour to obtain a powder of indium oxide aciculae. The powdery aciculae were coated with tin hydroxide in the same manner as in Example 15 and then calcined and reduced also in the same manner to obtain a powder of indium-tin oxide aciculae. The tin content in the powdery aciculae was 2.5% by weight, and the green compact resistance of the powder was 0.03 Ω.cm.

COMPARATIVE EXAMPLE 3

The first intermediate powder of aciculae that had been obtained in Example 15 was directly calcined in air at 1000° C. for one hour and then treated in a reducing atmosphere to obtain a powder of indium oxide aciculae. The green compact resistance of the thus-obtained powder was 0.36 Ω.cm.

EXAMPLE 20

Figure 20:
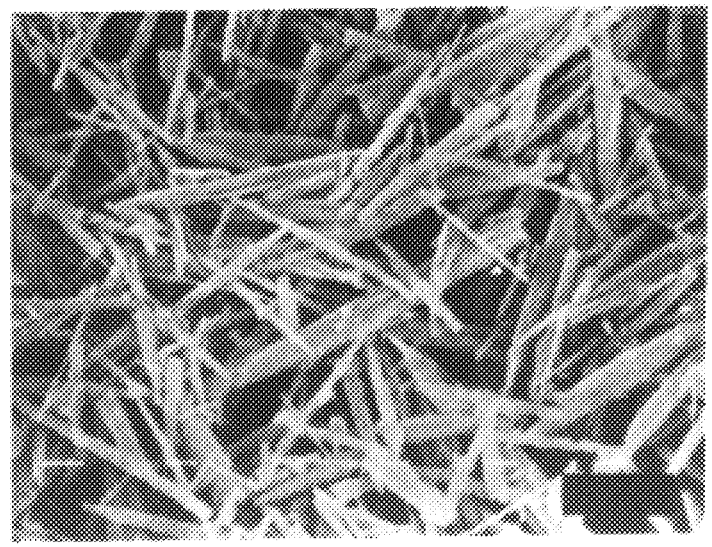
FIG. 20 is an electromicroscopic photograph showing the crystal structure of the fine powder of indium-tin oxide aciculae, that was used in Example 20 of the present invention.
Figure 21:
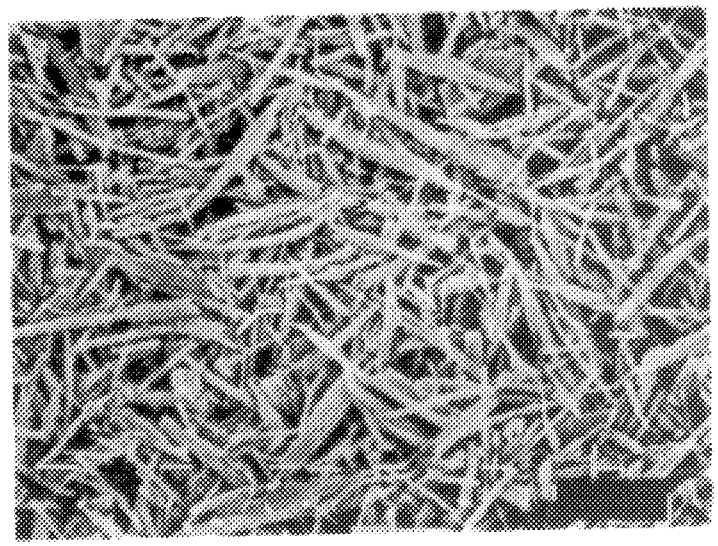
FIG. 21 is an electromicroscopic photograph showing the light-transmitting electroconductive film that was obtained in Example 20 of the present invention.

A fine powder of indium-tin oxide aciculae (ITO powder—its crystal structure is shown in FIG. 20) having a major diameter of 5 µm or more and an aspect ratio of 5 or more and having a specific resistance, as its green compact resistance, of 0.03 Ω.cm and a tin content of 2.6% by weight, that had been prepared by the applicant, and a resin liquid were formulated to have the composition of Paste No. 1 shown in Table 2 below, blended and well stirred, and the blend was filtered through a 200-mesh stainless steel gauze to obtain an electroconductive paste. The thus-obtained paste was printed on a soda lime glass sheet having a size of 75×75×1.1 mm and also on a 100 µm-thick polyester film (LUMIRROR T Type, trade name by Toray Co.) having the same size, both in a printed size of 4×5 cm by screen-printing, using a 200-mesh screen-printing plate, dried at 120° C. for 20 minutes and hardened to form a light-transmitting electroconductive film on the substrate. FIG. 21 is an electromicroscopic photograph (×2000) of the light-transmitting electroconductive film formed on the polyester film.

The thickness of the thus-formed electroconductive film, the surface resistance thereof, the complete light transmittance thereof, the haze value thereof and the weight thereof (the last was only for the film formed on the glass sheet) were measured. Since the surfaces of the films formed were rough, the film thickness was read out from the chart at the unit of 0.5 µm. Since the weight of the polyester film varied due to absorption of water, etc., the weight of the electroconductive film formed thereon was not measured. The specific resistance of the electroconductive film was obtained from its thickness and its surface resistance. The content by volume of the ITO powder in the film was obtained from its weight, its thickness and its paste composition.

Specific Resistance of Electroconductive Film =
Surface Resistance ($\Omega/\square$) × Film Thickness ($10^{-4}$ cm)
Content of ITO Powder (% by volume) =
Film Weight (g) × {ITO (g)/[ITO (g) + Resin (g)]} × {1/7.2 (specific gravity of ITO, g/cm$^3$)} × {1/(4 × 5 (area, cm$^2$) × Film Thickness ($10^{-4}$ cm)]} × 100

The film thickness was measured, using a surface roughness meter (Surfcom 900A, trade name by Tokyo Seimitsu KK); and the surface resistance was measured, using LORESTA MCP-T400 (trade name by Mitsubishi Petro-Chemical Co.). The complete light transmittance and the haze value were measured, using a direct-read haze computer HGM-ZDP (trade name by Suga Shiken Kikai KK), by applying the electroconductive film-coated glass sheet and polyester film to the machine.

EXAMPLE 21

Figure 22:
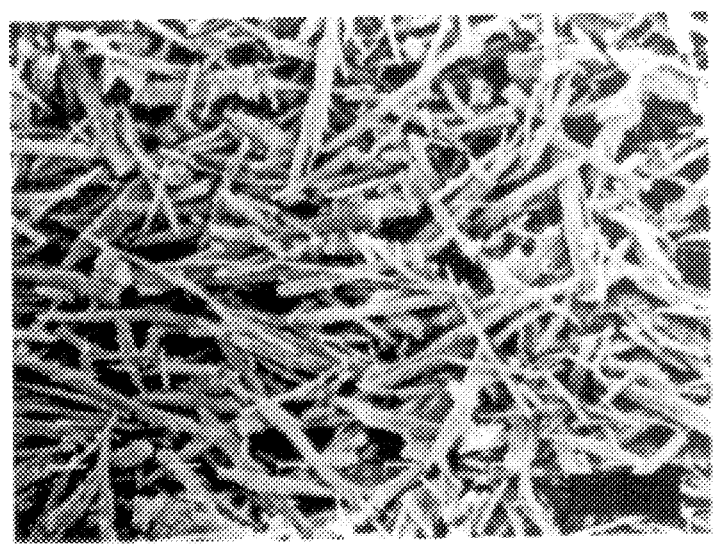
FIG. 22 is an electromicroscopic photograph showing the light-transmitting electroconductive film that was obtained in Example 21 of the present invention.

An electroconductive paste and light-transmitting electroconductive films were prepared in the same manner as in Example 20 using the same ITO powder, except that the composition of Paste No. 2 shown in Table 2 below was employed. FIG. 22 is an electromicroscopic photograph (×2000) of the light-transmitting electroconductive film formed on the polyester film. The properties of the thus-formed electroconductive films were measured in the same manner as in Example 20, and the data obtained are shown in Table 3 below, in which "Glass" means the glass sheet and "PET" means the polyester film.

EXAMPLE 22

Figure 23:
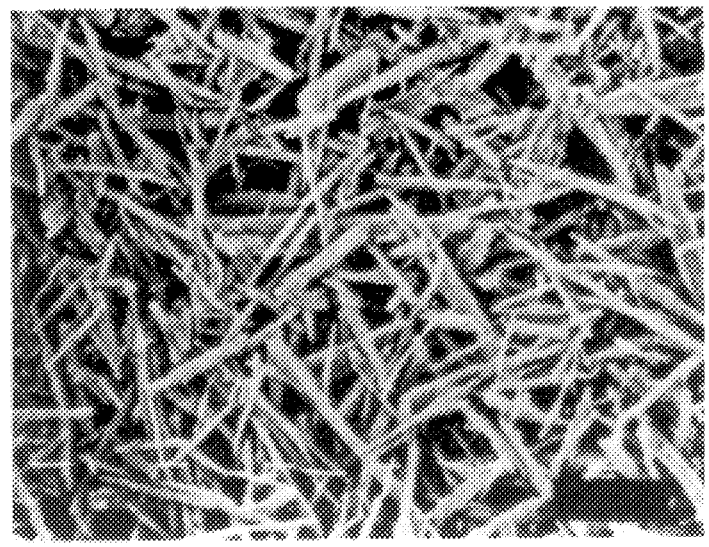
FIG. 23 is an electromicroscopic photograph showing the light-transmitting electroconductive film that was obtained in Example 22 of the present invention.

An electroconductive paste and light-transmitting electroconductive films were prepared in the same manner as in Example 20 using the same ITO powder, except that the composition of Paste No. 3 shown in Table 2 below was employed. FIG. 23 is an electromicroscopic photograph (×2000) of the light-transmitting electroconductive film formed on the polyester film. The properties of the thus-formed electroconductive films were measured in the same manner as in Example 20, and the data obtained are shown in Table 3 below.

EXAMPLE 23

Figure 24:
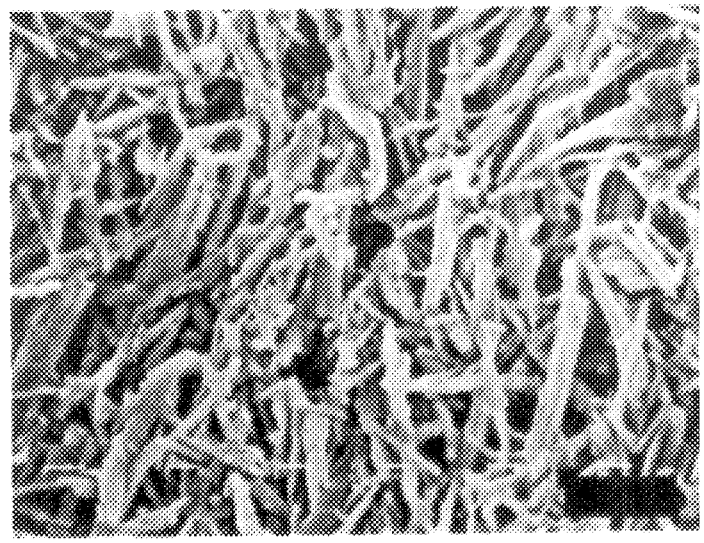
FIG. 24 is an electromicroscopic photograph showing the light-transmitting electroconductive film that was obtained in Example 23 of the present invention.

An electroconductive paste and light-transmitting electroconductive films were prepared in the same manner as in Example 20 using the same ITO powder, except that the composition of Paste No. 4 shown in Table 2 below was employed. FIG. 24 is an electromicroscopic photograph (×2000) of the light-transmitting electroconductive film formed on the polyester film. The properties of the thus-formed electroconductive films were measured in the same manner as in Example 20, and the data obtained are shown in Table 3 below.

EXAMPLE 24

Figure 25:
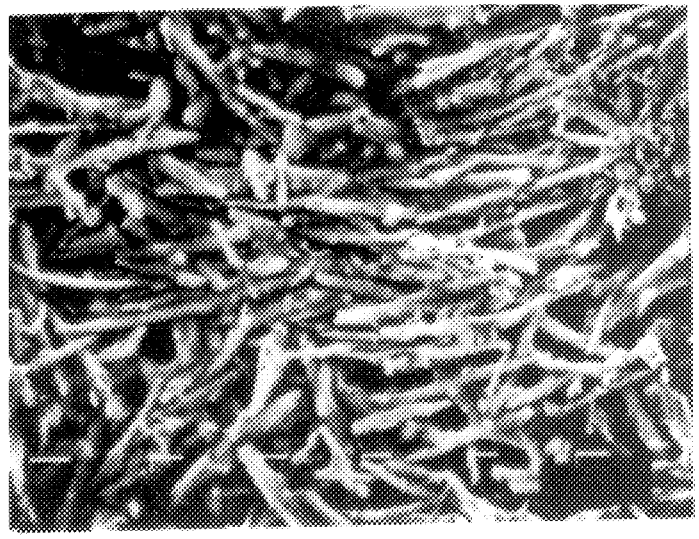
FIG. 25 is an electromicroscopic photograph showing the light-transmitting electroconductive film that was obtained in Example 24 of the present invention.

An electroconductive paste and light-transmitting electroconductive films were prepared in the same manner as in Example 20 using the same ITO powder, except that the composition of Paste No. 5 shown in Table 2 below was employed. FIG. 25 is an electromicroscopic photograph (×2000) of the light-transmitting electroconductive film formed on the polyester film. The properties of the thus-formed electroconductive films were measured in the same manner as in Example 20, and the data obtained are shown in Table 3 below.

EXAMPLE 25

Figure 26:
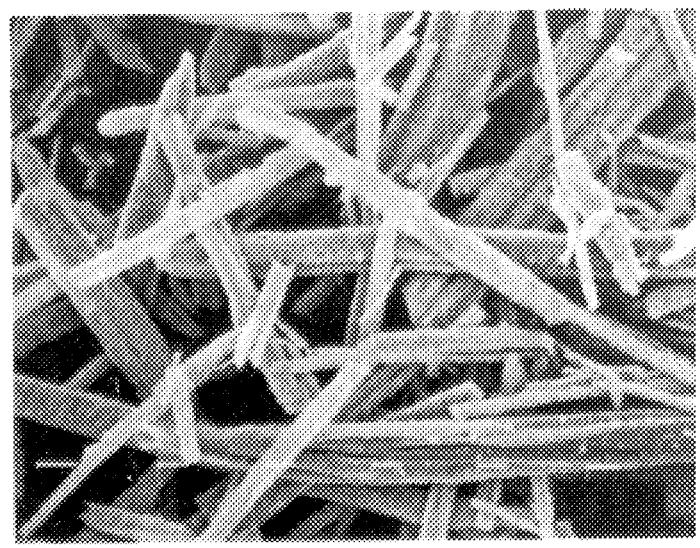
FIG. 26 is an electromicroscopic photograph showing the crystal structure of the fine powder of indium-tin oxide aciculae, that was used in Example 25 of the present invention.
Figure 27:
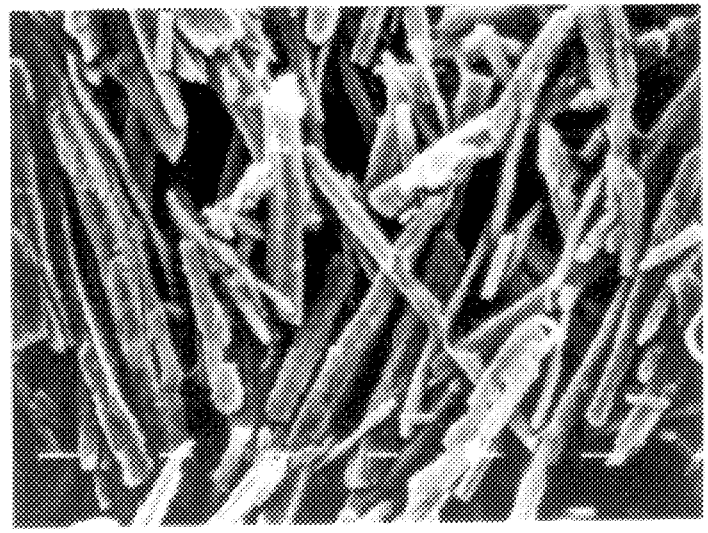
FIG. 27 is an electromicroscopic photograph showing the light-transmitting electroconductive film that was obtained in Example 25 of the present invention.

An electroconductive paste and light-transmitting electroconductive films were prepared in the same manner as in Example 20 using an ITO powder having a tin content of 2.6% by weight and a specific resistance of 0.03 $\Omega$.cm as its green compact resistance (FIG. 26 shows its crystal structure), except that the composition of Paste No. 6 shown in Table 2 below was employed. FIG. 27 is an electromicroscopic photograph (×2000) of the light-transmitting electroconductive film formed on the polyester film. The properties of the thus-formed electroconductive films were measured in the same manner as in Example 20, and the data obtained are shown in Table 3 below.

EXAMPLE 26

An electroconductive paste and light-transmitting electroconductive films were prepared in the same manner as in Example 20 using the same ITO powder as that used in Example 25, except that the composition of Paste No. 7 shown in Table 2 below was employed. The properties of the thus-formed electroconductive films were measured in the same manner as in Example 20, and the data obtained are shown in Table 3 below.

EXAMPLE 27

An electroconductive paste and light-transmitting electroconductive films were prepared in the same manner as in Example 20 using the ultraviolet-hardening resin shown in Table 2 below and using the same ITO powder as that used in Example 25, except that the composition of Paste No. 8 shown in Table 2 was employed. The properties of the thus-formed electroconductive films were measured in the same manner as in Example 20, and the data obtained are shown in Table 3 below. The electroconductive films formed were hardened, using Metal Hiland M01-L212 (made by Eyegraphic Co.) equipped with an illuminator (cold mirror type) UE011-201C, an electric power device UB01.51-3A/BM-E2 and a thermal ray-cutting filter, at an illuminance of 150 mW/cm$^2$ for 20 seconds in nitrogen gas.

EXAMPLE 28

An electroconductive paste and light-transmitting electroconductive films were prepared in the same manner as in Example 20 using the same ITO powder as that used in Example 20, except that the composition of Paste No. 9 shown in Table 2 below was employed. The properties of the thus-formed electroconductive films were measured in the same manner as in Example 20, and the data obtained are shown in Table 3 below.

EXAMPLE 29

Figure 28:
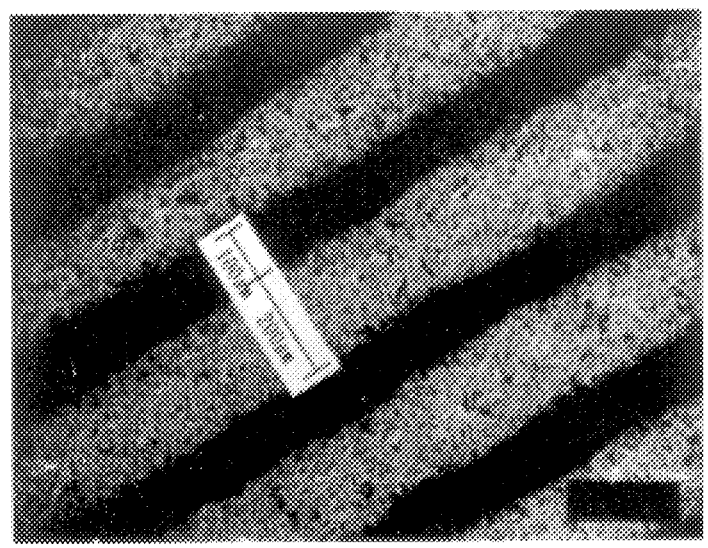
FIG. 28 is an electromicroscopic photograph showing the line patterns through the light-transmitting electroconductive film that was obtained in Example 29 of the present invention.

Using the electroconductive paste that had been prepared in Example 22, lines of 3.3 lines/mm were printed by screen printing in the same manner as in Example 20. FIG. 28 is a microscopic photograph (×100) of the light pattern of the thus-obtained light-transmitting electroconductive film.

EXAMPLE 30

Using the electroconductive paste that had been prepared in Example 25, an organic dispersion-type EL device was prepared. First, on the aluminium surface of a polyester film having a thickness of 100 μm, an area of 4×5 cm and a surface resistance of 0.95 Ω/□, of which one surface had been coated with aluminium by vapor deposition, a barium titanate paste (TU-217, made by Tohoku Kako KK) was printed by screen-printing, using a 200-mesh printing screen, and dried to form thereon an insulating layer (dielectric layer) having a size of 4×5 cm. Over the insulating layer, a zinc sulfide paste (TU-219, made by Tohoku Kako KK) was printed and dried two times each in a size of 4×5 cm. Over this, the electroconductive paste that had been prepared in Example 23 was printed in a size of 3×4 cm by screen-printing, using a 200-mesh printing screen, and dried at 120° C. for 10 minutes to form thereon a light-transmitting electroconductive film.

A voltage-applying lead wire was connected to one end of the light-transmitting electroconductive film, while a resistance-measuring lead wire to the other end thereof; and a voltage-applying lead wire was connected to one end of the aluminium-coated surface of the polyester film. The both surfaces of the laminate were coated with a water-trapping film having a size of 4×5 cm. The thus-coated laminate was wrapped with a fluorine-containing- film having a size of 5×6 cm for moisture-proofing lamination, while the ends of the above-mentioned lead wires were made exposed out of the both sides of the laminate. thus, an EL device was prepared.

The resistance between the voltage-applying lead wire and the resistance-measuring lead wire that had been connected to the both ends of the light-transmitting electroconductive film to obtain the surface resistance of the light-transmitting electroconductive film. A pseudo-trapezoidal wave voltage of 106 V and 800 Hz was applied between the voltage-applying lead wire that had been connected to one end of the light-transmitting electroconductive film and the voltage-applying lead wire that had been connected to one end of the aluminium-coated surface of the polyester film, by which the EL device emitted light. The intensity of the luminance of the thus-emitted light was measured, and the data obtained are shown in Table 4 below. The measurement of the intensity of the luminance was effected, using a luminometer (BM-8 Model, made by TOPCON Co.)

EXAMPLE 31

An EL device was prepared in the same manner as in Example 30, except that the paste of Example 28 was employed. The EL device was measured in the same manner as in Example 30, and the data obtained are shown in Table 4 below.

COMPARATIVE EXAMPLE 4

An electroconductive paste and light-transmitting electroconductive films were prepared in the same manner as in Example 18 using the same ITO powder as that used in Example 18, except that the composition of Paste No. 10 in Table 2 was used. The films thus formed were measured in the same manner as in Example 18, and the data obtained are shown in Table 3 below.

COMPARATIVE EXAMPLE 5

Figure 29:
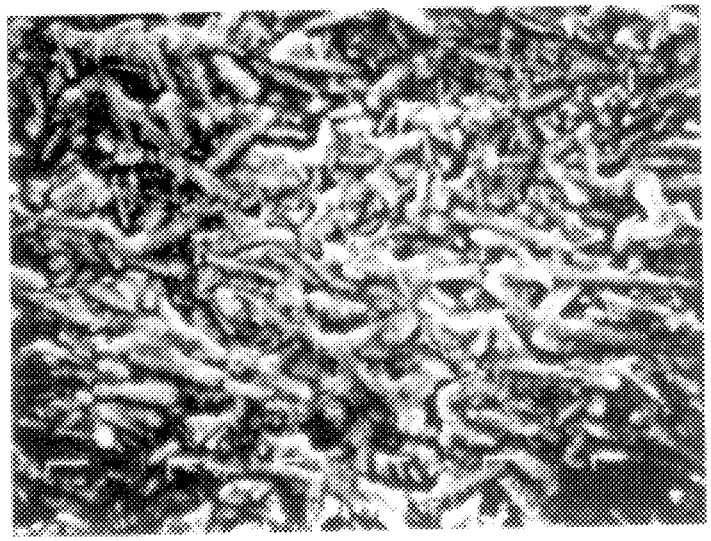
FIG. 29 is an electromicroscopic photograph showing the light-transmitting electroconductive film that was obtained in Comparative Example 5.

The electroconductive paste of Example 20 was strongly dispersed, using a three-roll mill, so that many of the ITO aciculae were broken. Thus, a paste containing many ITO aciculae having an aspect ratio of less than 5 was prepared. Using the paste, light-transmitting electroconductive films were formed in the same manner as in Example 18. FIG. 29 is an electromicroscopic photograph (×2000) of the light-transmitting electroconductive film formed on the polyester film. The films were measured in the same manner as in Example 18, and the data obtained are shown in Table 3 below.

COMPARATIVE EXAMPLE 6

Figure 30:
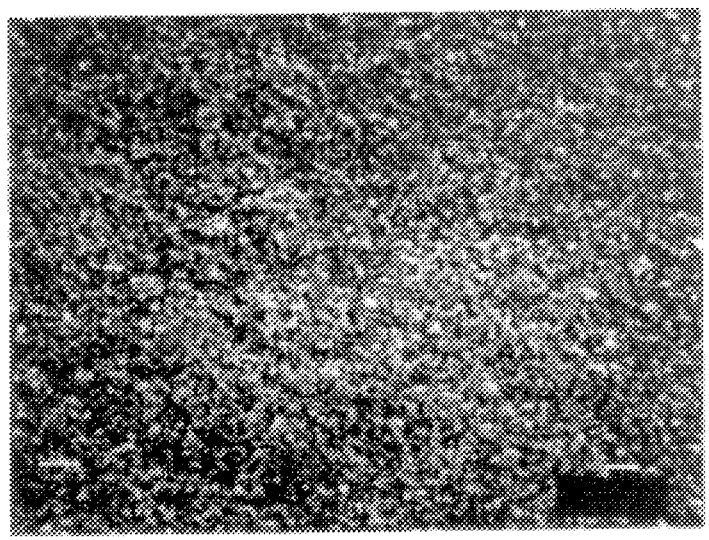
FIG. 30 is an electromicroscopic photograph showing the light-transmitting electroconductive film that was obtained in Comparative Example 6.

A commercial electroconductive paste having the composition of Paste No. 11 shown in Table 2 below (X-101, trade name by tohoku Kako KK) was prepared, in which the electroconductive filler comprising an ultra-fine powder of ITO having a mean particle size of 0.03 μm was dispersed in the acrylic resin and the solvent. This was printed on a soda lime glass having a size of 75×75×1.1 mm thick and also on a polyester film (LUMIRROR T Type, made by Toray Co.) having a thickness of 100 μm and a size of 75×75 mm, both in a printed size of 4×5 cm by screen-printing, using a 300-mesh screen-printing plate, dried with infrared rays at 50° C. for 10 minutes and then at 120° C. for 5 minutes to form a light-transmitting electroconductive film on the substrate. FIG. 30 is an electromicroscopic photograph (×10000) of the light-transmitting electroconductive film formed on the polyester film.

TABLE 2

| | Components of Paste Composition | % by weight | Ratio of ITO Powder/Resin (by weight) |
|---|---|---|---|
| Paste 1 | ITO powder | 40.0 | 80:20 |
| | Acrylic Resin A (Thermolac M-45C, trade name by Soken Kagaku KK) | 10.0 | |
| | Solvent A (isophorone) | 50.0 | |
| Paste 2 | ITO powder | 30.5 | 70:30 |
| | Acrylic Resin A | 13.0 | |
| | Solvent A | 56.5 | |
| Paste 3 | ITO powder | 29.0 | 67.5:32.5 |
| | Acrylic Resin A | 14.0 | |
| | Solvent A | 57.0 | |
| Paste 4 | ITO powder | 27.7 | 65:35 |
| | Acrylic Resin A | 14.9 | |
| | Solvent A | 57.4 | |
| Paste 5 | ITO powder | 27.0 | 60:40 |
| | Acrylic Resin A | 18.0 | |
| | Solvent A | 55.0 | |
| Paste 6 | ITO powder | 29.4 | 67.5:32.5 |
| | Acrylic Resin B (Dianal BR-80, trade name by Mitsubishi Rayon Co.) | 14.1 | |
| | Solvent A | 56.5 | |
| Paste 7 | ITO powder | 29.8 | 67.5:32.5 |
| | Thermosetting Acrylic Resin (Magicron No. 1000, trade name by Kansai Paint Co.) | 19.1 | |
| | Solvent A | 41.1 | |
| Paste 8 | ITO powder | 34.2 | 60:40 |
| | Vinyl Ester Resin (RIPOXY VR-77, trade name by Showa High Polymer Co.) | 13.7 | |
| | Trimethylolpropane Triacrylate | 8.0 | |
| | 2-Hydroxy-2-methyl-1 phenylpropanone-1 | 1.1 | |
| | Solvent A | 43.0 | |
| Paste 9 | ITO Powder | 30.5 | 67:33 |
| | Thermoplastic High-dielectric Resin (Cyanoresin CR-S, trade name by Shin-etsu Chemical Co.) | 15.5 | |
| | Solvent (γ-butyrolactone) | 53.0 | |
| Paste 10 | ITO powder | 21.5 | 50:50 |
| | Resin A | 21.5 | |
| | Solvent A | 57.0 | |
| Paste 11 | ITO powder | 29.0 | 88:12 |

TABLE 2-continued

Figure 32:
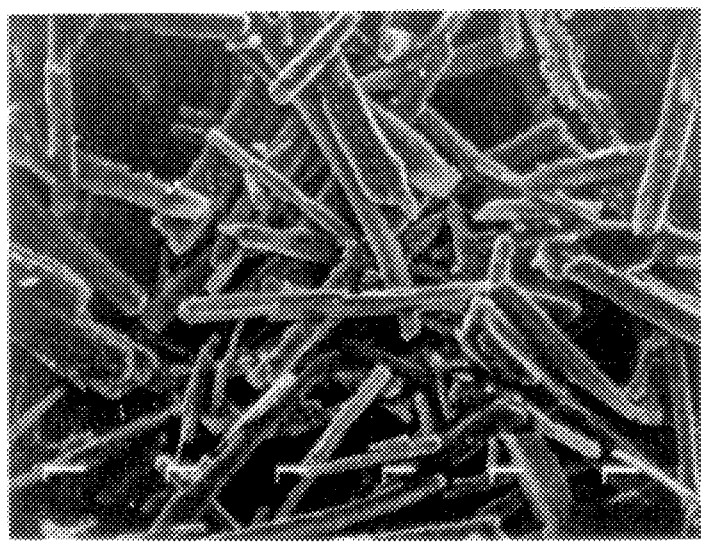
FIG. 32 is an electromicroscopic photograph showing the light-transmitting electroconductive film that was obtained in Example 32 of the present invention.

| Components of Paste Composition | % by weight | Ratio of ITO Powder/Resin (by weight) |
|---|---|---|
| Resin A | 6.9 | |
| Solvent A | 42.7 | | light-transmitting electroconductive film on the substrate. FIG. 32 is an electromicroscopic photograph (×2000) of the light-transmitting electroconductive film thus formed. Table 6 below shows the thickness of the film, the surface resistance thereof, the complete light transmittance thereof (380 to 780 nm), the haze value thereof and the specific resistance thereof.

The film thickness was measured, using a surface roughness meter (Surfcom 900A, trade name by Tokyo Seimitsu KK). Since the surface of the film was rough, the film

TABLE 3

| Example No. | Composition of Paste | Substrate | Film Thickness ($\mu$m) | ITO Content (% by volume) | Surface Resistance ($\Omega/\square$) | Specific Resistance of Film ($\Omega \cdot$ cm) | Complete Light Transmittance (%) | Haze Value (%) |
|---|---|---|---|---|---|---|---|---|
| 18 | 1 | Glass | 7.5 | 19.7 | 630 | 0.47 | 40.1 | 92.8 |
|  |  | PET | 6.5 |  | 405 | 0.26 | 44.3 | 92.6 |
| 19 | 2 | Glass | 6.0 | 17.5 | 383 | 0.23 | 58.7 | 92.8 |
|  |  | PET | 6.0 |  | 342 | 0.21 | 59.4 | 92.8 |
| 20 | 3 | Glass | 6.0 | 17.6 | 410 | 0.25 | 62.5 | 92.6 |
|  |  | PET | 6.0 |  | 405 | 0.24 | 64.3 | 92.7 |
| 21 | 4 | Glass | 5.0 | 16.5 | 486 | 0.24 | 64.2 | 92.8 |
|  |  | PET | 5.0 |  | 468 | 0.23 | 65.8 | 92.7 |
| 22 | 5 | Glass | 5.5 | 15.0 | 1500 | 0.83 | 70.3 | 92.6 |
|  |  | PET | 5.5 |  | 1100 | 0.61 | 72.1 | 92.5 |
| 23 | 6 | Glass | 5.0 | 15.8 | 347 | 0.17 | 77.1 | 82.2 |
|  |  | PET | 7.0 |  | 147 | 0.10 | 73.0 | 90.7 |
| 24 | 7 | Glass | 9.0 | 19.8 | 189 | 0.17 | 63.7 | 91.2 |
|  |  | PET | 14.0 |  | 176 | 0.25 | 61.6 | 92.0 |
| 25 | 8 | Glass | 8.0 | 16.9 | 140 | 0.11 | 50.5 | 92.2 |
|  |  | PET | 8.0 |  | 145 | 0.12 | 52.0 | 92.0 |
| 26 | 9 | Grass | 6.0 | 16.2 | 490 | 0.29 | 60.4 | 92.7 |
|  |  | PET | 6.0 |  | 410 | 0.25 | 65.3 | 92.6 |
| Comparative Example 4 | 10 | Glass | 5.0 | 12.3 | $1.5 \times 10^4$ | 7.5 | 78.0 | 91.5 |
|  |  | PET | 6.0 |  | $1.1 \times 10^4$ | 6.6 | 79.0 | 91.6 |
| Comparative Example 5 | 3 | Glass | 4.0 | 21.1 | 4820 | 1.93 | 70.5 | 92.5 |
|  |  | PET | 4.5 |  | 3870 | 1.74 | 70.0 | 92.7 |
| Comparative Example 6 | 11 | Glass | 1.9 | 43.4 | 630 | 0.12 | 80.7 | 9.3 |
|  |  | PET | 2.5 |  | 520 | 0.13 | 78.5 | 10.6 |

TABLE 4

| | Light-transmitting Electroconductive Film (electroconductive paste) | Surface Resistance ($\Omega/\square$) | EL Intensity (cd/m$^2$) |
|---|---|---|---|
| Example 28 | ITO Powder Film (Paste No. 6) | 188 | 198 |
| Example 29 | ITO Powder Film (Paste No. 9) | 720 | 212 |

EXAMPLE 32

Figure 31:
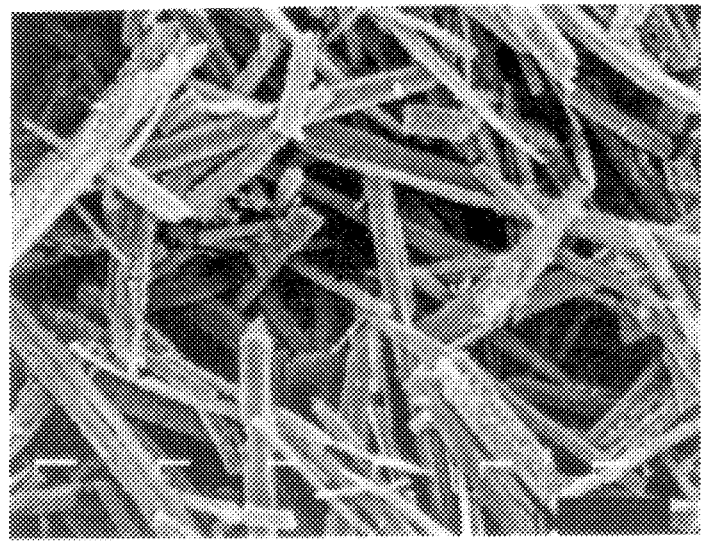
FIG. 31 is an electromicroscopic photograph showing the crystal structure of the fine powder of indium-tin oxide aciculae, that was used in Example 32 of the present invention.

A fine powder of indium-tin oxide aciculae (ITO powder—its crystal structure is shown in FIG. 31) having a major diameter of 5 $\mu$m or more and an aspect ratio of 5 or more and having a specific resistance, as its green compact resistance, of 0.02 $\Omega$.cm and a tin content of 2.5% by weight, that had been prepared by the applicant, and a glass frit were formulated to have the composition of Paste No. 1 shown in Table 5 below, blended and well stirred, and the blend was filtered through a 200-mesh stainless steel gauze to obtain an electroconductive paste. The thus-obtained paste was printed on a soda lime glass sheet having a size of 75×75× 1.1 mm, in a printed size of 4×5 cm by screen-printing, using a 200-mesh screen-printing plate, dried at 120° C. for 20 minutes and baked in air at 54° C. for 10 minutes to form a thickness was read out from the chart at the unit of 0.5 $\mu$m. The surface resistance was measured, using LORESTA MCP-T400 (trade name by Mitsubishi Petro-Chemical Co.). The complete light transmittance and the haze value were measured, using a direct-read haze computer EGM-ZDP (trade name by Suga Shiken Kikai KK), by applying the electroconductive film-coated glass to the machine.

EXAMPLE 33

Figure 33:
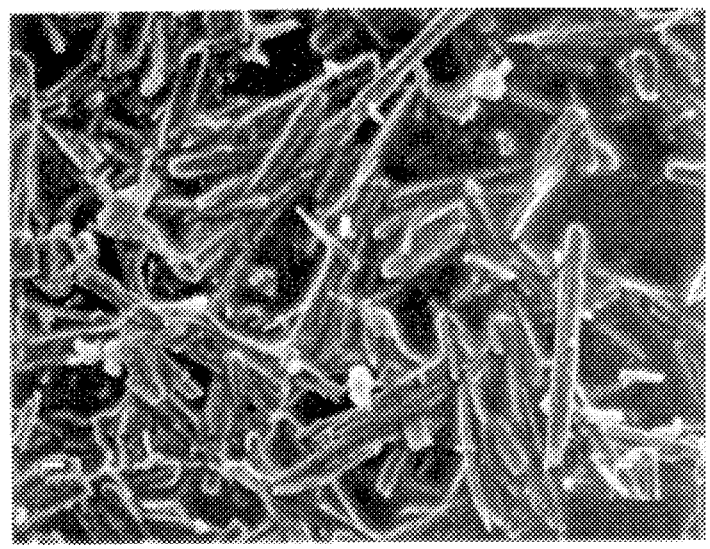
FIG. 33 is an electromicroscopic photograph showing the light-transmitting electroconductive film that was obtained in Example 33 of the present invention.

An electroconductive paste and a light-transmitting electroconductive film were prepared in the same manner as in Example 32 using the same ITO powder as that used in Example 32, except that the composition of Paste No. 2 shown in Table 5 below was employed. FIG. 33 is an electromicroscopic photograph (×2000) of the light-transmitting electroconductive film formed. The thickness of the film, the surface resistance thereof, the complete light transmittance thereof (380 to 780 nm), the haze value thereof and the specific resistance thereof were measured in the same manner as in Example 32, and the data obtained are shown in Table 6 below.

EXAMPLE 34

An electroconductive paste and a light-transmitting electroconductive film were prepared in the same manner as in Example 33, except that a 150-mesh screen-printing plate was used. The thickness of the thus-obtained light-transmitting electroconductive film, the surface resistance thereof, the complete light transmittance thereof (380 to 780 nm), the haze value thereof and the specific resistance thereof were measured in the same manner as in Example 32, and the data obtained are shown in Table 6 below.

EXAMPLE 35

An electroconductive paste and a light-transmitting electroconductive film were prepared in the same manner as in Example 33 using the same ITO powder as that used in Example 32, except that the composition of Paste No. 3 shown in Table 5 below was employed and that the baking of the coated film was effected in air at 560° C. for 10 minutes. The thickness of the thus-obtained light-transmitting electroconductive film, the surface resistance thereof, the complete light transmittance thereof (380 to 780 nm), the haze value thereof and the specific resistance thereof were measured in the same manner as in Example 32, and the data obtained are shown in Table 6 below.

EXAMPLE 36

An electroconductive paste and a light-transmitting electroconductive film were prepared in the same manner as in Example 35, except that a 150-mesh screen-printing plate was used. The thickness of the thus-obtained light-transmitting electroconductive film, the surface resistance thereof, the complete light transmittance thereof (380 to 780 nm), the haze value thereof and the specific resistance thereof were measured in the same manner as in Example 32, and the data obtained are shown in Table 6 below.

EXAMPLE 37

An electroconductive paste and a light-transmitting electroconductive film were prepared in the same manner as in Example 36, except that a low-alkali glass having a size of 75×75×1.1 mm was used as the substrate and that the baking of the coated film was effected in air at 600° C. for 10 minutes. The thickness of the thus-obtained light-transmitting electroconductive film, the surface resistance thereof, the complete light transmittance thereof (380 to 780 nm), the haze value thereof and the specific resistance thereof were measured in the same manner as in Example 32, and the data obtained are shown in Table 6 below.

COMPARATIVE EXAMPLE 7

An electroconductive paste and a light-transmitting electroconductive film were prepared in the same manner as in Example 32 using the same ITO powder as that used in Example 32, except that the composition of Paste No. 4 shown in Table 5 below was employed. The thickness of the thus-obtained light-transmitting electroconductive. film, the surface resistance thereof, the complete light transmittance thereof (380 to 780 nm), the haze value thereof and the specific resistance thereof were measured in the same manner as in Example 32, and the data obtained are shown in Table 6 below.

TABLE 5

| | Components | Content (wt. %) | Ratio by volume of ITO Powder/Glass Frit (*2) |
|---|---|---|---|
| Paste 1 | ITO Powder | 25 | 44.5/55.5 |
| | Glass Frit | 25 | |
| | (GA-9, made by Nippon Electric Glass Co.) | | |
| | Ethyl Cellulose Solution (*1) | 25 | |
| | Terpineol | 25 | |
| Paste 2 | ITO Powder | 14.8 | 25.6/74.4 |
| | Glass Frit | 34.4 | |
| | (GA-9, made by Nippon Electric Glass Co.) | | |
| | Ethyl Cellulose Solution (*1) | 34.4 | |
| | Terpineol | 16.4 | |
| Paste 3 | ITO Powder | 14.8 | 14.9/85.1 |
| | Glass Frit | 34.4 | |
| | (GA-12, made by Nippon Electric Glass Co.) | | |
| | Ethyl Cellulose Solution (*1) | 34.4 | |
| | Terpineol | 16.4 | |
| Paste 4 | ITO Powder | 14.8 | 14.9/85.1 |
| | Glass Frit | 34.4 | |
| | (GA-12, made by Nippon Electric Glass Co.) | | |
| | Ethyl Cellulose Solution (*1) | 34.4 | |
| | Terpinel | 16.4 | |

(*1) Solution prepared by dissolving 4 g of ethyl cellulose in 96 g of terpineol.
(*2) The specific gravity of glass frit GA-9 was 5.77, and that of glass frit GA-12 was 2.95 ing this, the ratio was calculated.

TABLE 6

| Example No. | Composition of Paste | Film Thickness ($\mu$m) | Surface Resistance ($\Omega/\Box$) | Specific Resistance of Film ($\Omega \cdot$ cm) | Complete Light Transmittance (%) | Haze Value (%) |
|---|---|---|---|---|---|---|
| 30 | 1 | 8.0 | 5.4 | 4.3 | 63.2 | 88.1 |
| 31 | 2 | 4.5 | 4.6 | 2.1 | 87.5 | 87.2 |

TABLE 6-continued

| Example No. | Composition of Paste | Film Thickness (μm) | Surface Resistance (Ω/□) | Specific Resistance of Film (Ω · cm) | Complete Light Transmittance (%) | Haze Value (%) |
|---|---|---|---|---|---|---|
| 32 | 2 | 6.0 | 2.7 | 1.6 | 83.7 | 83.7 |
| 33 | 3 | 8.0 | 2.7 | 2.2 | 72.9 | 72.9 |
| 34 | 3 | 9.5 | 0.95 | 0.90 | 71.1 | 71.1 |
| 35 | 3 | 9.0 | 0.81 | 0.73 | 77.2 | 77.2 |
| Comparative Example 7 | 4 | 14.5 | 6.9 | 10.0 | 42.0 | 42.0 |

As has been explained in detail hereinabove, the present invention has the following advantages.

(1) The present invention provides a raw material for producing a powder of indium-tin oxide aciculae, which has a suitable aspect ratio and a low resistance and is suitable as an electroconductive filler for an electroconductive ink to produce a transparent electroconductive film.

(2) The present invention provides an electroconductive paste capable of forming a light-transmitting electroconductive film having sufficient electroconductivity and light transmittance, and the film is widely useful for forming a light-transmitting electrode in, for example, electroluminescence (EL) devices, etc.

While the invention has been described in detail and with reference to specific embodiments thereof, it will be apparent to one skilled in the art that various changes and modifications can be made therein without departing from the spirit and scope thereof.

What is claimed is:

1. An electroconductive paste containing a fine powder of indium-tin oxide aciculae having a length of 5 μm to 100 μm and an aspect ratio of length to cross-sectional diameter of 5 to 30 in a light-transmitting resin along with its solvent.

2. The electroconductive paste as claimed in claim 1, wherein the ratio by weight of the fine powder of indium-tin oxide aciculae to the resin is from 60:40 to 80:20.

3. An electroconductive paste for high-temperature baking, which contains a transparent glass frit, a solvent and a fine powder of indium-tin oxide aciculae having a length of 5 μm to 100 μm and an aspect ratio of length to cross-sectional diameter of 5 to 30.

4. The electroconductive paste as claimed in claim 3, wherein the ratio by volume of the fine powder of indium-tin oxide aciculae to the transparent glass frit is from 10:90 to 50:50.

* * * * *